United States Patent [19]

Kao

[11] Patent Number: 5,642,367
[45] Date of Patent: Jun. 24, 1997

[54] FINITE FIELD POLYNOMIAL PROCESSING MODULE FOR ERROR CONTROL CODING

[75] Inventor: Rom Shen Kao, Durham, N.C.

[73] Assignee: Mitsubishi Semiconductor America, Inc., Durham, N.C.

[21] Appl. No.: 192,909

[22] Filed: Feb. 7, 1994

[51] Int. Cl.$^6$ .................................................. G11C 29/00
[52] U.S. Cl. ........................................ 371/40.1; 371/37.1
[58] Field of Search ............................... 371/37.1, 37.4, 371/38.1, 39.1, 40.1, 40.2, 40.3, 40.4

[56] References Cited

U.S. PATENT DOCUMENTS

| | | | |
|---|---|---|---|
| 3,811,108 | 5/1974 | Howell | 371/37.1 |
| 4,584,686 | 4/1986 | Fritze | 371/37 |
| 4,649,541 | 3/1987 | Lahmeyer | 371/37 |
| 4,747,103 | 5/1988 | Iwamura et al. | 371/37.4 |
| 4,763,332 | 8/1988 | Glover | 371/37 |
| 4,777,635 | 10/1988 | Glover | 371/40 |
| 4,841,300 | 6/1989 | Yoshida et al. | 341/94 |
| 4,852,098 | 7/1989 | Brechard et al. | 371/37 |
| 4,873,688 | 10/1989 | Maki et al. | 371/37.1 |
| 5,099,482 | 3/1992 | Cameron | 371/37.1 |
| 5,170,399 | 12/1992 | Cameron et al. | 371/37.1 |
| 5,329,535 | 7/1994 | Coker | 371/39.1 |
| 5,381,423 | 1/1995 | Turco | 371/39.1 |
| 5,444,719 | 8/1995 | Cox et al. | 371/37.1 |
| 5,535,140 | 7/1996 | Iwamura | 371/40.1 |

OTHER PUBLICATIONS

Kao, Rom-Shen; A Multiplier-Free Fast Transform with Efficient VLSI Implementation for Polynomial RNS Processors; IEEE 1991.

Kao, Rom-Shen et al.; The Basis-Change Algorithm for Fast Finite Field Transforms; IEEE Proceedings. 1991.

S. Sakata; "Extension of the Berlekamp-Massey Algorithm to N Dimensions", Information and Computation, vol. 84, pp. 207-239, 1990.

*Primary Examiner*—Paul P. Gordon
*Assistant Examiner*—Brian C. Oakes
*Attorney, Agent, or Firm*—Lowe, Price, LeBlanc & Becker

[57] ABSTRACT

A single module for performing polynomial arithmetic operations over finite fields is provided in an error correcting system for correcting Reed-Solomon codewords with mixtures of errors and erasures in an optical disk storage. The module comprises two-dimensional register arrays, which serve as a working area to store initial data and intermediate results of the polynomial operations. A set of multiplier-adder units performs multiplication and addition operations under the data supplied from the register arrays based on finite field arithmetic over the Galois field $GF(2^8)$. A set of multiplexers routes the input data to the corresponding multiplier-adder units depending on the polynomial functions to be performed. In response to initial condition signals, a control system determines what polynomial functions are to be performed by the polynomial processing module and supplies the module with control signals to provide the data control in the register arrays and selection of the multiplexers.

23 Claims, 17 Drawing Sheets

Step Reduction Scheme for Euclidean Algorithm

EXAMPLE 1:

| column: | 0 | 1 | 2 | 3 | 4 | 5 |
|---|---|---|---|---|---|---|
| | 2 | 5 | 8 | b | e | |
| | 1 | 4 | 7 | a | d | |
| | 0 | 3 | 6 | 9 | c | f |

RA
deg[r(z)]=13 ---> Step Count=5

| column: | 0 | 1 | 2 |
|---|---|---|---|
| | 2 | 5 | 8 |
| | 1 | 4 | 7 |
| ... | 0 | 3 | 6 |
| 0 | | | |

QA  YA
deg[y(z)]=1 ---> Step Count=1

EXAMPLE 2:

| column: | 0 | 1 | 2 | 3 | 4 | 5 |
|---|---|---|---|---|---|---|
| | 2 | 5 | 8 | b | e | |
| | 1 | 4 | 7 | a | d | |
| | 0 | 3 | 6 | 9 | c | f |

RA
deg[r(z)]=8 ---> Step Count=3

| column: | 0 | 1 | 2 |
|---|---|---|---|
| | 2 | 5 | 8 |
| | 1 | 4 | 7 |
| ... | 0 | 3 | 6 |
| 0 | | | |

QA  YA
deg[y(z)]=6 ---> Step Count=3

Fig. 18

FINITE FIELD POLYNOMIAL PROCESSING MODULE FOR ERROR CONTROL CODING

TECHNICAL FIELD

The present invention relates generally to error correction, and more particularly, to a polynomial processing module that performs various polynomial operations during a Reed-Solomon code decoding procedure.

BACKGROUND ART

Since a storage medium is subject to various types of noise, distortion and interference, various errors can occur at the output of the storage medium, including erasure of written data. The massive amount of digital data stored in an optical disk storage increases the probability of the errors and erasures. To correct the errors and erasures, error control coding is used. Reference is now made to FIG. 1, wherein an error correction system comprises an encoder 22, which transforms an input information sequence entered on the optical disk storage into code words.

In optical disk applications the code words are encoded based on International Standard Organization (ISO) Standard that requires Cyclic Redundancy Check (CRC) encoding and incorporates a Reed-Solomon (RS) code over some Galois fields. The RS (n,k) code is a cyclic symbol error-correcting code where k symbols of an original data are encoded. The result, which is an (n-k)-symbol redundancy block, is appended to the data. The Galois field is a finite field, the elements of which may be represented as polynomials with a particular primitive element as variables. The RS code represents a block sequence of a Galois field $GF(2^m)$ of $2^m$ binary symbols, where m is the number of bits per symbol. Constructing the Galois field $GF(2^m)$ requires a generator polynomial $p(x)$ of degree m and a primitive element $\beta$, which is a root of $p(x)$. The powers of $\beta$ generate all nonzero elements of $GF(2^m)$. Encoding and decoding circuitry is therefore required which has a capability of performing Galois field arithmetic.

The encoder 22 generates, in k steps, (n-k) redundancy bytes, which are appended to the original code data to make a n-byte code word. A writing unit 24 records the coded data on an optical disk 26.

A reading unit 28 unloads data from the optical disk 26 and transfers them to a decoding section 30. The decoding section 30 comprises a syndrome generator 32, which detects errors and generates syndrome bytes $S(x)$ for each word received from the optical disk. The syndrome (n-k) bytes are supplied to an Euclidean operation circuit 34, which finds an error location polynomial $\sigma(x)$ and error value polynomial $\eta(x)$ using an extended Euclidean algorithm. The Euclidean operation circuit 34 is connected to an error locating circuit 36, which uses the Chien Search process to find actual error locations based on the error location polynomial $\sigma(x)$. The error locations together with the error value polynomial $\sigma(x)$ and error location polynomial $\eta(x)$ are used by an error value calculator 38 to determine error value at each error location found by the Chien Search process. An error correcting circuit 40 uses known error locations and values to correct the errors.

Inasmuch as in RS code decoding procedure codewords and the intermediate data bytes are regarded as polynomials with coefficients over some finite fields, polynomial arithmetic operations are usually performed during the decoding procedure. These operations fall into the following categories:

1) recursive division and multiplication used in the Extended Euclidean algorithm;
2) polynomial expansion to find erasure polynomial based on the known erasure locations;
3) modulo polynomial multiplication to calculate modified syndrome polynomial; and
4) regular polynomial multiplication to obtain erasure/error location polynomial.

Detailed description of these functions is stated as follows.

Recursive multiplication and division

In Reed-solomon code decoding, Extended Euclidean algorithm is often used to calculate error location polynomial $\sigma(z)$ and error value polynomial $\eta(z)$. This algorithm is actually used to perform recursive division of two polynomials $r_0(z)$ and $r_1(z)$ to find the polynomial $\eta(z)$ (i.e. $r_i(z)$), and to perform recursive multiplication and accumulation to the intermediate quotients to find the polynomial $\sigma(z)$ (i.e. $yt(z)$). The operation sequences are presented as the following equation sequences.

| Iteration | Division | Multiplication |
|---|---|---|
| 0 | $r_0(z)=p_0(z)*r_1(z)+r_2(z)$ | $y_2(z)=q_0(z)*y_1(z)+y_0(z)$, |
| 1 | $r_1(z)=q_1(z)*r_2(z)+r_3(z)$ | $y_3(z)=q_1(z)*y_2(z)+y_1(z)$, |
| ... | | |
| i-2 | $r_{i-2}(z)=q_{i-2}(z)*r_{i-1}(z)+r_i(z)$, | $y_i(z)=q_{i-2}(z)*y_{i-1}(z)+y_{i-2}(z)$, |

(1)

These iterations stop when the degree of the remainder $\deg[r_i(z)]$ is less than some predetermined number u, where $u=\lfloor(d-1+\epsilon)/2\rfloor$, $\epsilon$ is the number of erasures and d is a minimum distance. Error value polynomial $\eta(z)$ is the remainder $r_i(z)$ and error location polynomial $\sigma(z)$ is $y_i(z)$.

2) Polynomial expansion

For a set of known erasure locations $\alpha_0, \alpha_1, \ldots, \alpha_i$, where $i \leq d-2$. The corresponding erasure polynomial $\sigma_z(z)$ becomes $$\sigma_z(z)=(z-\alpha_1) \ldots (z-\alpha_i)=z^{i+1}+a_i z^i+ \ldots +a_2 z^2+a_1 z+a_0 \quad (2)$$

3) Regular polynomial multiplication For two polynomials $p_1(z)$ and $p_2(z)$ with degrees n and m respectively. The product of the multiplication is $$p_1(z)*p_2(z)=b_{n+m}z^{n+m}+b_{n+m-1}z^{n+m-1}+ \ldots +b_1 z+b_0 \quad (3)$$

4) Modulo polynomial multiplication

For two polynomials $r_1(z)$ and $r_2(z)$ with degrees n and m respectively. The result of the (modulo $z^k$)—multiplication, where $k \geq n+m$, is $$r_1(z) * r_2(z) = (c_{n+m}z^{n+m} + c_{n+m-1}z^{n+m-1} + \ldots + \qquad (4)$$
$$c_1z + c_0) \bmod z^k$$
$$= c_{k-1}z^{k-1} + c_{k-2}z^{k-2} + \ldots + c_1z + c_0$$

The operation complexity shown in Equations (1) to (4) is proportional to the degree of the initial polynomials. For codes having high correction capability, the data generated during decoding process represent polynomials with high degree. Consequently, the decoding procedure becomes a time-consuming task for a conventional processor to handle.

To perform each of the above-described operations, a decoder equipped with separate modules for each of the operations is required. It results in logic redundancy.

Further, lengthy calculations to perform each of the above-described polynomial operations separately drastically degrade the overall performance of the error correction system.

In view of the above, it would be desirable to provide a single polynomial processing module with flexible control modes that can perform various polynomial operations.

DISCLOSURE OF THE INVENTION

Accordingly, one advantage of the invention is in reducing logic redundancy of an error decoding circuitry.

Another advantage of the invention is in increasing the throughput of an error correction system.

The above and other advantages of the invention are achieved, at least in part, by providing a system for correcting errors in corrupted data that comprises a plurality of register means for storing Galois field polynomial data representing the corrupted data. Arithmetic means are responsive to the register means for performing multiplication and addition of the polynomial data read from the register means. Control means supply the register means and arithmetic means with control signals to provide recursive multiplication and division, polynomial expansion and polynomial multiplication of the polynomial data simultaneously. In response to the arithmetic means, locating and correcting the errors are provided.

In accordance with a preferred embodiment of the invention, each of the register means comprises a plurality of shift register arrays arranged to store the polynomial data in rows and columns that shift the stored polynomial data along the rows and columns. The arithmetic means comprise a plurality of multiplier-adder sets connectable to the shift register arrays. Multiplexing means couple the shift register arrays to the multiplier-adder sets. The control means comprise user interface means for supplying the apparatus with initialization signals to set a mode of operation. A finite state machine is responsive to the initialization signals for supplying enabling signal to control data in the register means.

In accordance with one aspect of the invention, a system for determining errors and erasures in data read from an optical disk memory means comprises a plurality of registers responsive to the read data for storing signals indicating occurrence of the errors and erasures. A plurality of multiplier-adder sets are connectable to the registers for generating signals indicating location of the errors and their value in a first mode of operation, and for generating signals indicating value of erasures in a second mode of operation. A control circuit is coupled to the multiplier-adder sets for switching the multiplier-adder sets between the first and second modes of operation. The multiplier-adder sets perform recursive division and multiplication of the signals stored in the registers in the first mode of operation, and perform polynomial expansion of the signals stored in the registers in the second mode of operation.

Also, the multiplier-adder sets perform polynomial multiplication in a third mode of operation. The control circuit provides signal paths between the registers and the multiplier-adder sets switchable to provide switching between the first, second and third modes of operation. A multiplexer supplies each of the multiplier-adder sets with the signals from the corresponding registers in accordance with the mode of operation. This multiplexer may supply the corresponding register with an output signal of the multiplier-adder sets to store an intermediate result of operations. Each of the registers may comprise a plurality of shift register arrays arranged in rows and columns for shifting the stored data along the rows and columns. A finite state machine of the control circuit supplies the registers with a shift control signal to control shifting the stored data along the rows and columns.

In accordance with the method of this invention, the following steps are carried out:

storing polynomial data indicating occurrence of the errors and erasures in the read data, performing recursive division and multiplication of the polynomial data in a first mode of operation, performing polynomial expansion of the polynomial data in a second mode of operation, performing modulo polynomial multiplication of the polynomial data in a third mode of operation, performing regular polynomial multiplication of the polynomial data in a fourth mode of operation, and switching between the first, second, third and fourth modes of operation to generate signals indicating values and locations of said errors and erasures.

Preferably, steps of performing operations under polynomial data overlap with one other.

Still other advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 18 shows examples of the step reduction scheme applied to the Euclidean Algorithm.

BEST MODE FOR CARRYING OUT THE INVENTION

The best mode for practicing the invention is based on the realization that error correction circuitry in an optical disk storage is capable of correcting RS codewords with up to eight errors (e) or sixteen erasures ($\epsilon$) or mixtures of errors and erasures under the requirement of 2e+$\epsilon$<17. To meet these requirements, register arrays with three-row configuration and a multiplier-adder set comprising three multiplier-adders are selected. It is to be understood that for error correction circuitry that requires more correction ability and/or higher processing speed, the same architecture can be adapted to include more multiplier-adders with matched register array configuration.

Figure 1:
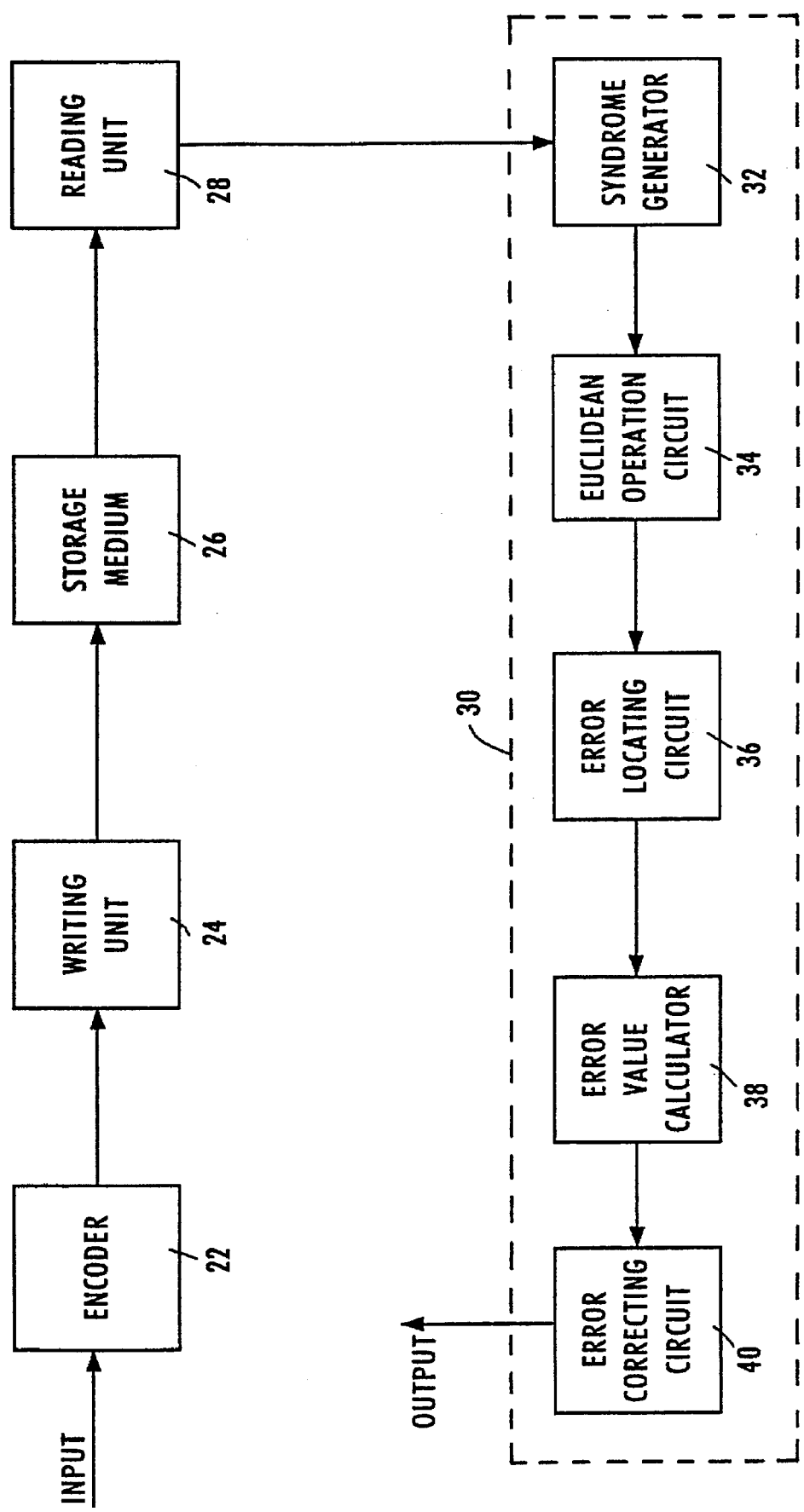
FIG. 1 is a block-diagram of a system for correcting errors in an optical disk storage.
Figure 2:
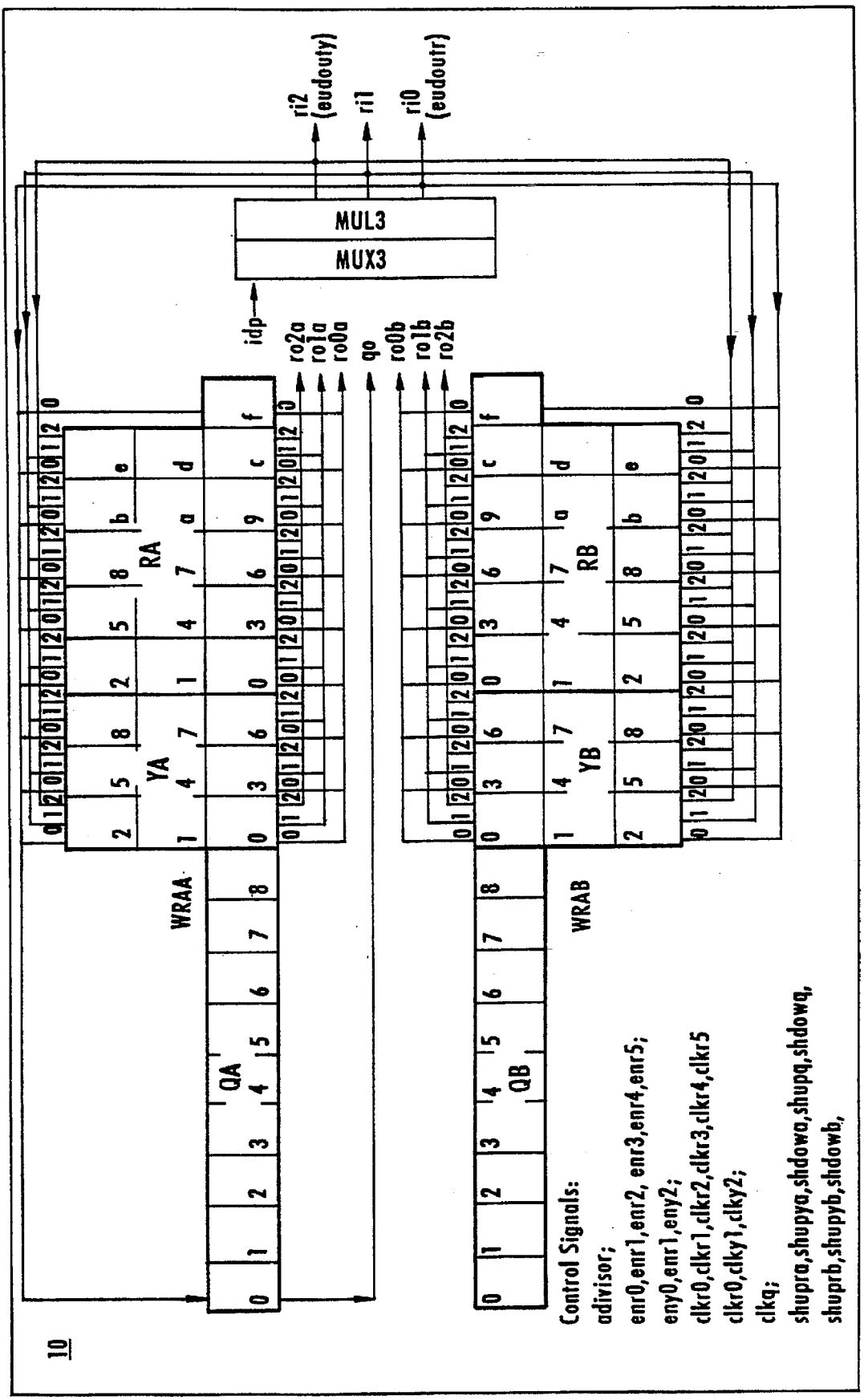
FIG. 2 is a diagram illustrating the polynomial processing module (PPM) of the present invention.

Referring to FIG. 2, a Polynomial Processing Module (PPM) 10 of the present invention comprises a Working Register Array A (WRAA) and a Working Register Array B (WRAB) for storing polynomial data generated using the data read from the optical disk. A Multiplier-Adder Set (MUL3) performs operations under the polynomial data written in the WRAA and WRAB based on finite field arithmetic over the field $GF(2^8)$. A Multiplexer Set (MUX3) provides signal paths to route corresponding polynomial data from the WRAA and/or WRAB to the MUL3 and to output the processed intermediate results back to the WRAA and/or WRAB.

More specifically, the WRAA comprises three types of register arrays RA, YA and QA that serve as a working area to store initial data and intermediate results of polynomial arithmetic operations. The register array RA includes sixteen 8-bit byte cells RA[0] to RA[f] arranged in a 2-dimensional matrix having 3 rows and 6 columns. For example, cell RA[0] is located at row 0, column 0, whereas cell RA[f] is in row 0, column 5. The register array RA is able to shift data vertically one byte at a time from lower bytes to higher bytes under control of a control system described in more detail later. For example, after a first shift, the byte stored in cell RA[f] is pushed out of the array, the byte from RA[e] moves into RA[f], the byte from RA[d] moves into RA[e], and so on. At the same time, the byte stored in RA[0] moves into RA[1] and is replaced with an input byte written into RA[0].

The register array YA comprises nine 8-bit byte cells YA[0] to YA[8] and arranged in a matrix with 3 rows and 3 columns. Byte data stored in the YA may be shifted vertically one byte at a time in up or down direction.

The register array QA comprises nine 8-bit byte cells QA[0] to QA[8] arranged in one row and is able to shift data in both directions one byte at a time.

The WRAB is arranged symmetrically with respect to the WRAA and comprises register arrays RB, YB and QB having the same configuration as the registers RA, YA and QA, respectively.

Figure 3:
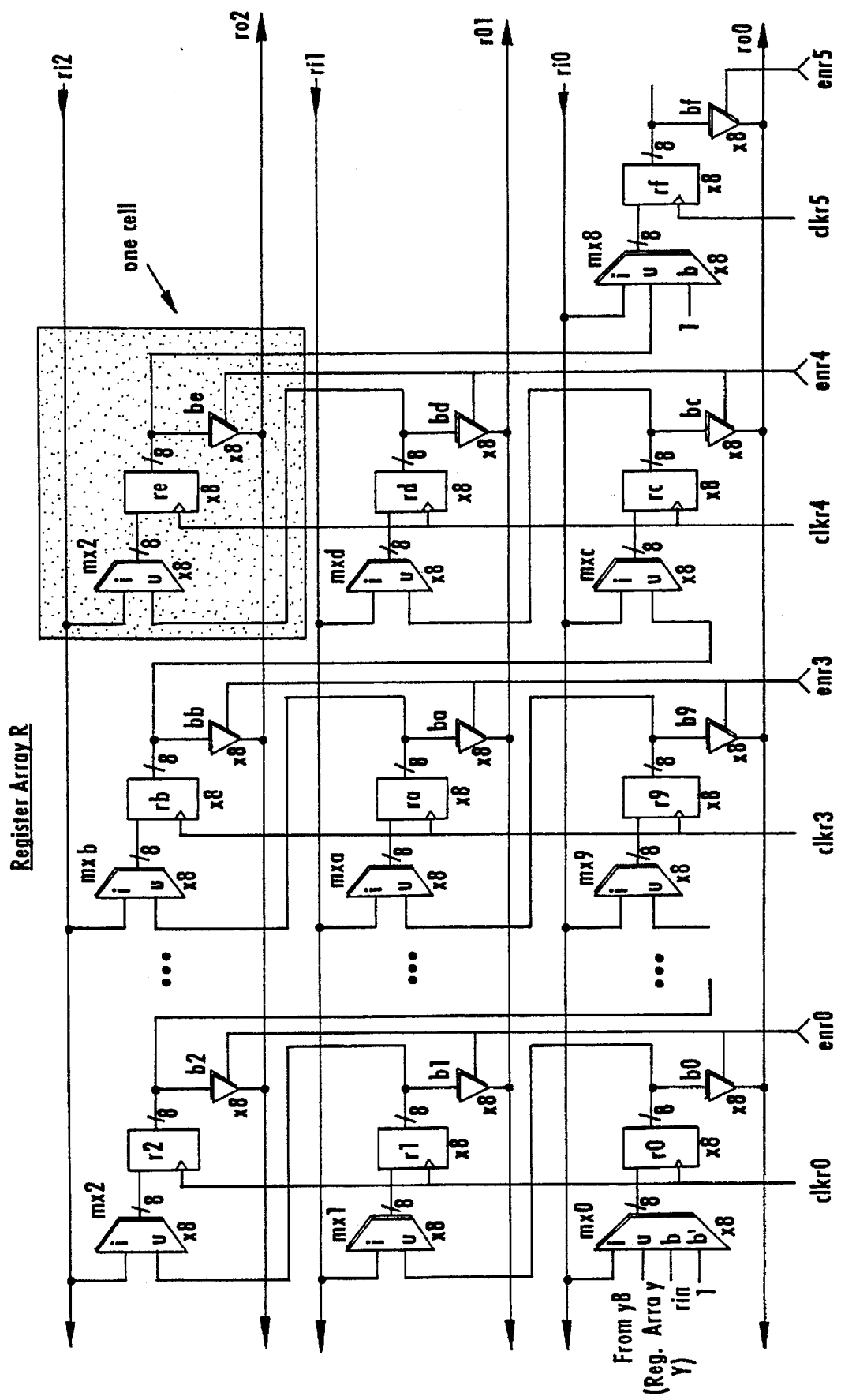
FIG. 3 is a diagram illustrating the register array R (RA or RB) shown in FIG. 2.

As shown in FIG. 3, the register arrays R (RA and RB) comprise registers r0 to rf for each of cells RA[0] to RA[f] of the RA and cells RB[0] to RB[f] of the RB. Each of the registers r0 to rf comprises 8 flip-flops for storing one bit of the 8-bit byte stored in the register. Also, each of the cells 0 to f comprises 8 multiplexers shown in the diagram as integral blocks mx0 to mxf, for supplying the corresponding flip-flops with input data, and 8 tri-state buffers shown as integral blocks b0 to bf, for supplying corresponding buses with output data of the registers. For cells 1 to e, the multipliers provide data ri0, ri1, or ri2 from the multiplier-adder set MUL3 or data from the previous register in a shift operation. In addition, registers rf are supplied with an initial condition signal represented by a logical "1". Cells RA[0] and RB[0] are supplied with data ri0 from the MUL3, data from cells YA[8] and YB[8], respectively, and initial condition signals "1" and rin.

Figure 4:
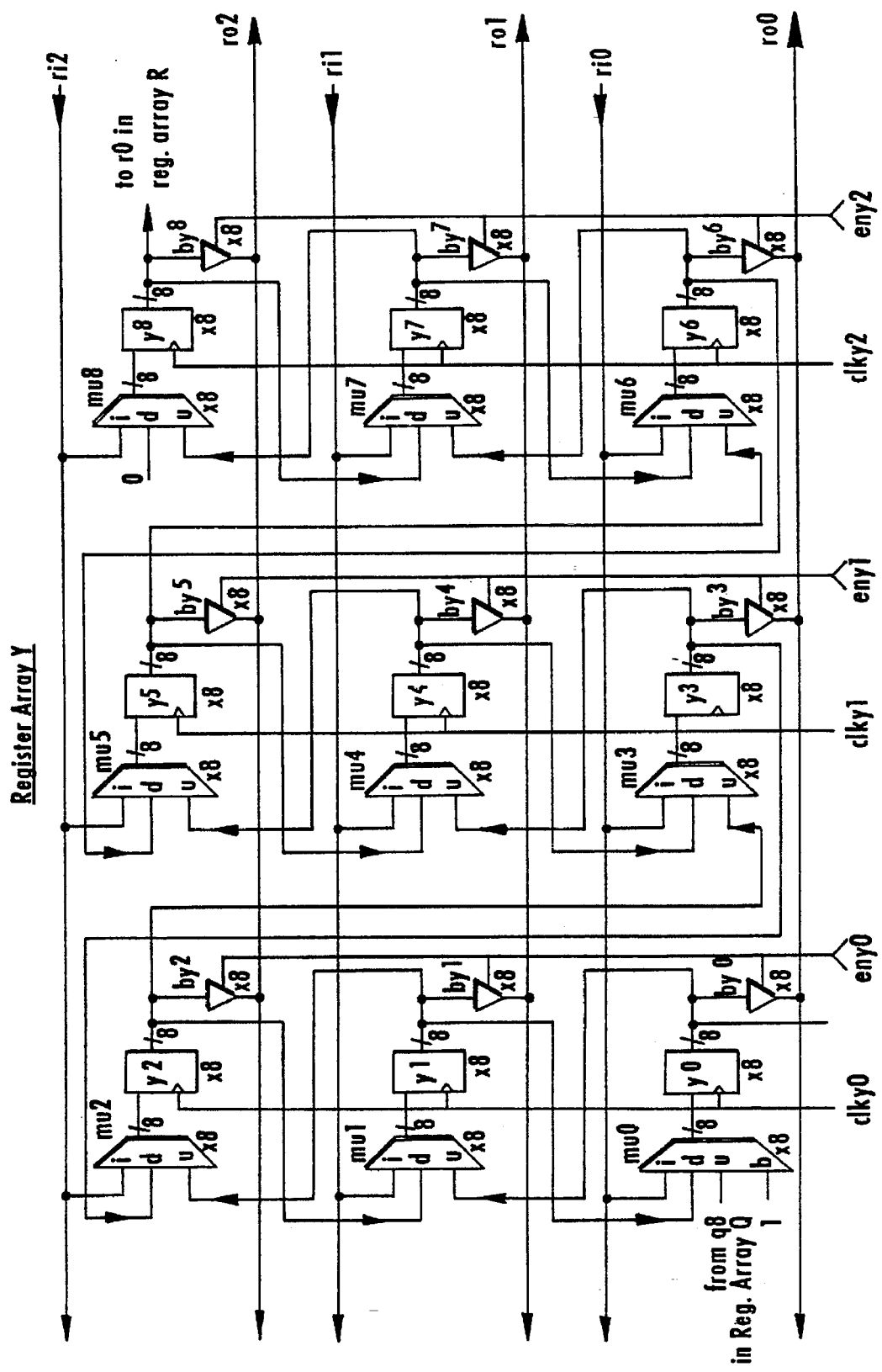
FIG. 4 is a diagram illustrating the register array Y (YA or YB) shown in FIG. 2.

Output data of a cell are supplied to MUX3 through a bus ro0, ro1 or ro2 of a corresponding row. In FIG. 2 these buses are shown as buses ro0a, ro1a and ro2a for WRAA and buses ro0b, ro1b and ro2b for WRAB. The cells in each of the columns 0 to 5 are respectively supplied with control signals clk0 to clk5 and enr0 to enr5 generated by the control system disclosed later. For example, during multiplication or division operation, data from MUL3 are latched into cells of column i by the signal clki. The enable signal enri causes data from cells in column i to go to the buses ro0, ro1 or ro2 through the corresponding tri-state buffers. Referring to FIG. 4, the register arrays Y (YA and YB) comprise registers y0 to y8 in each of the cells Y[0] to Y[8], respectively. Each of the registers y0–y8 comprises 8 flip-flops (shown as single blocks) for holding one bit of 8-bit byte stored in the register. Each of the cells Y[0] to Y[8] comprises 8 multiplexers (shown as integral blocks mu0 to mu8, respectively) for supplying input data to the corresponding registers. Further, each of the cells Y[0] to Y[8] comprises 8 tri-state buffers (shown as integral blocks by0 to by8, respectively) to supply output data of the registers to a corresponding bus. As shown in FIG. 2, the arrays YA and YB use the same buses ro0a, ro1a, ro2a and ro0b, ro1b, ro2b, as the arrays RA and RB, respectively. The input data of the registers are supplied from the MUL3 through corresponding bus ri0, ri1 or ri2 or from the adjacent cell. In addition, Y[8] has a "0" initial condition input when down-shift is performed, and Y[0] has a "1" initial condition input when up-shift is performed. Also, one of the inputs of Y[0] is supplied with the data shifted from cell Q[8] of the arrays QA and QB when up-shift is performed. The data transfer in the arrays Y are controlled by control signals clky0 to clky2 and eny0 to eny2 provided by the control system.

Figure 5:
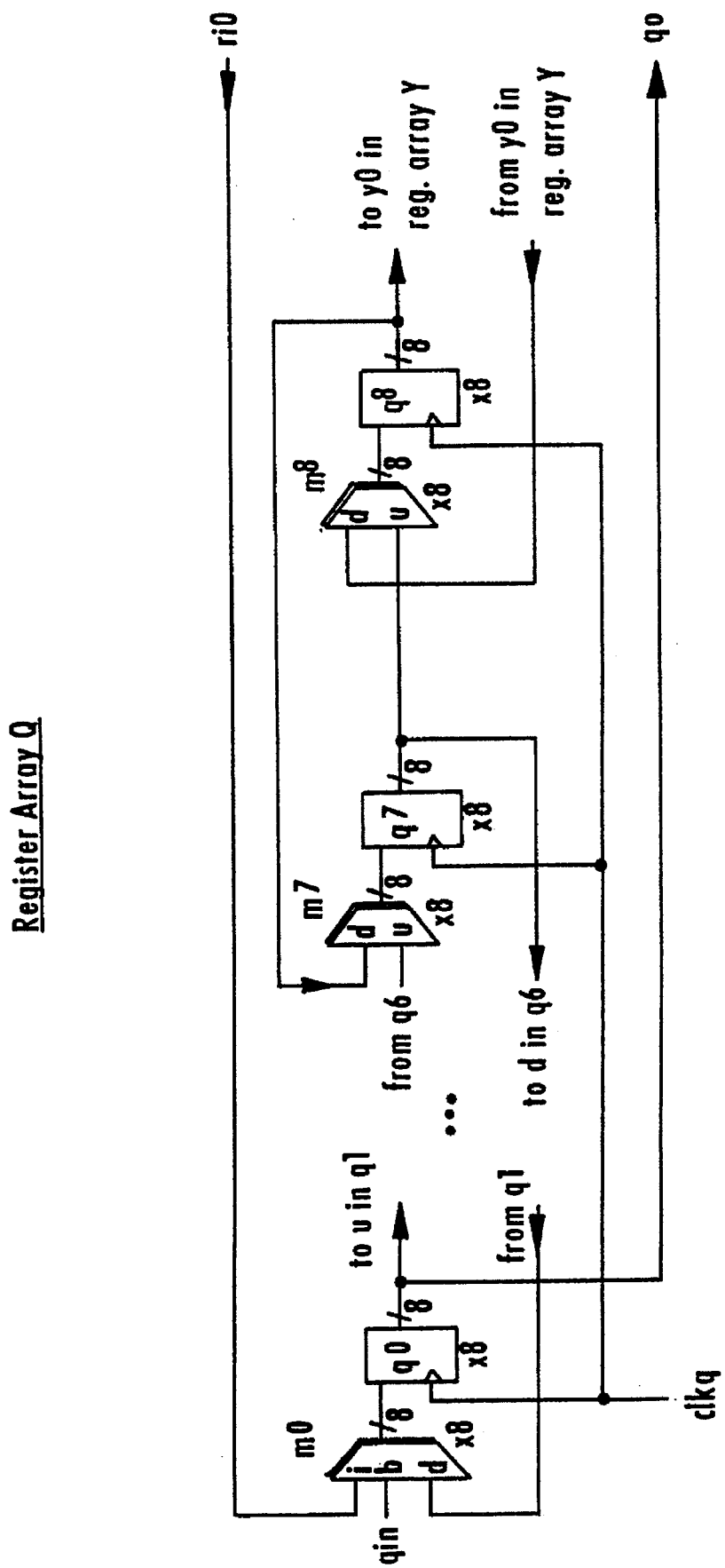
FIG. 5 is a diagram illustrating the register array Q (QA or QB) shown in FIG. 2.

As shown in FIG. 5, register arrays Q (QA and QB) comprise registers q0 to q8 in each of the cells Q[0] to Q[8], respectively. Each of these registers comprises 8 flip-flops. Also, each of the cells Q[0] to Q[8] comprises 8 multiplexers (shown as integral blocks m0 to m8, respectively) for supplying corresponding registers with data from the bus ri0 or from the adjacent cell. In addition, cell Q[0] is supplied with an initial condition signal qin. Further, cell Q[8] is supplied with the data from Y[0] when down-shift is performed. A control signal clkq generated by the control system controls the data transfer in the array. External input and output involve only the cell Q[0] coupled to an input bus ri0 and/or output bus q0 (quotient output).

Figure 6:
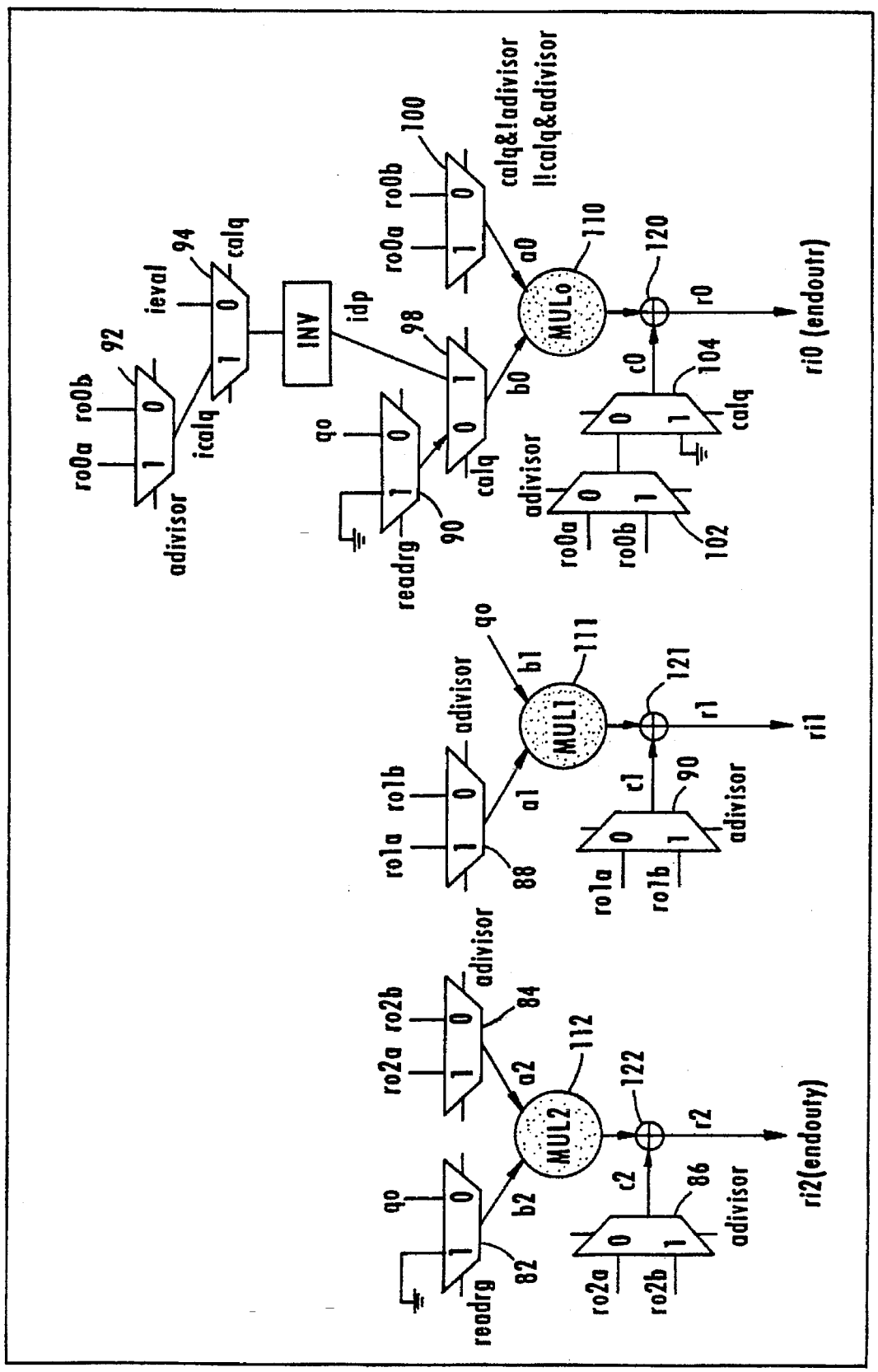
FIG. 6 is a diagram illustrating interconnection between the register arrays WRAA, WRAB and the multiplier-adder set MUL3 via the multiplexer set MUX 3.

Referring to FIG. 6, the multiplexer set MUX3 provides routing of the WRAA and WRAB output lines to the corresponding multiplier-adder MUL0, MUL1 or MUL2 of the set MUL3 shown in FIG. 2. The routes are selected depending on a function to be performed. More specifically, the multiplier-adders MUL0, MUL1 and MUL2 may be supplied with input data through four input buses:

1) quotient output bus q0 from QA,

2) WRAA buses ro0a, ro1a, ro2a from RA and YA,

3) WRAB buses ro0b, ro1b, ro2b from RB and YB, and 4) inverse table data bus idp from a lookup table INV, used in polynomial division.

In addition to supplying the multiplier-adder set MUL3 with the input data, the module MUX3 provides output channel to transfer the processed results from MUL3 to the register arrays through buses ri0, ri1 and ri2. Also, the module MuX3 provides output channel to extract the resultant polynomials through the buses ri0, ri1 and ri2 out of the PPM module.

The multiplexer set MUX3 may comprise multiplexers 82, 84 and 86 associated with the multiplier-adder MUL2, multiplexers 88 and 90 coupled to the multiplier-adder MUL1 and multiplexers 92–104 that provide routine of data for operations performed by the multiplexer-adder MUL0. Each of the multiplexers 82–104 has two data inputs, a control input and an output.

In particular, the multiplexers 82 and 84 supply a multiplier section 112 of the multiplier-adder MUL2 with signals b2 and a2 formed by multiplexing data from the buses q0, ro2a and ro2b. The first input of the multiplexer 82 is grounded. The multiplexer 86 supplies an adder section 122 of MUL2 with signal c2 provided in response to data from buses r02a, r02b.

The multiplexers 88 and 90 respectively supply a multiplexer section 111 and adder section 121 of MUL1 with signals a1 and c1 formed by multiplexing data from buses r01a and ro1b. The bus q0 is directly connected to the multiplier section 111 to provide signal b1.

The multiplier 100 supplied with data from the buses ro0a and ro0b provides a multiplier section 110 of MUL0 with signal a0. The combination of multiplexers 102 and 104 forms signal c0 supplied to an adder section 120 of MUL0. Signal b0 is formed by the combination of multipliers 96 and 98 based on input data in the bus q0 from the register array QA and in the bus idp from the lookup table INV that enables processing module to perform a division operation of the Euclidean algorithm. The table INV is a 256-by-8 finite field inverse table that allows the module to convert a divisor to the multiplicand inverse of the divisor in order to replace division with multiplication.

The lookup table INV is supplied by the multiplexer 94 having an external signal level at one of its inputs. The second input of the multiplexer 94 is coupled to the output of the multiplexer 92 having the buses ro0a and ro0b coupled to its inputs. Control inputs of the multiplexers 82–104 are supplied with signals advisor, readrg and calq disclosed in more detail later.

Output signals r0, r1 and r2 of the multiplier-adders MUL0, MUL1 and MUL2 are supplied to the buses ri0, ri1 and ri2, respectively. For example, the bus ri2 (endouty) sends the multiplication-addition data back to WRAA or WRAB in regular operation and acts as an output channel in a reading mode when the signal readrg is set to 1 (b2 is set to 0). In this example, error location polynomials stored in YA or YB during the Euclidean operation are read and transferred to next decoding stage in the system, for example, to a Chien Search block.

Figure 7:
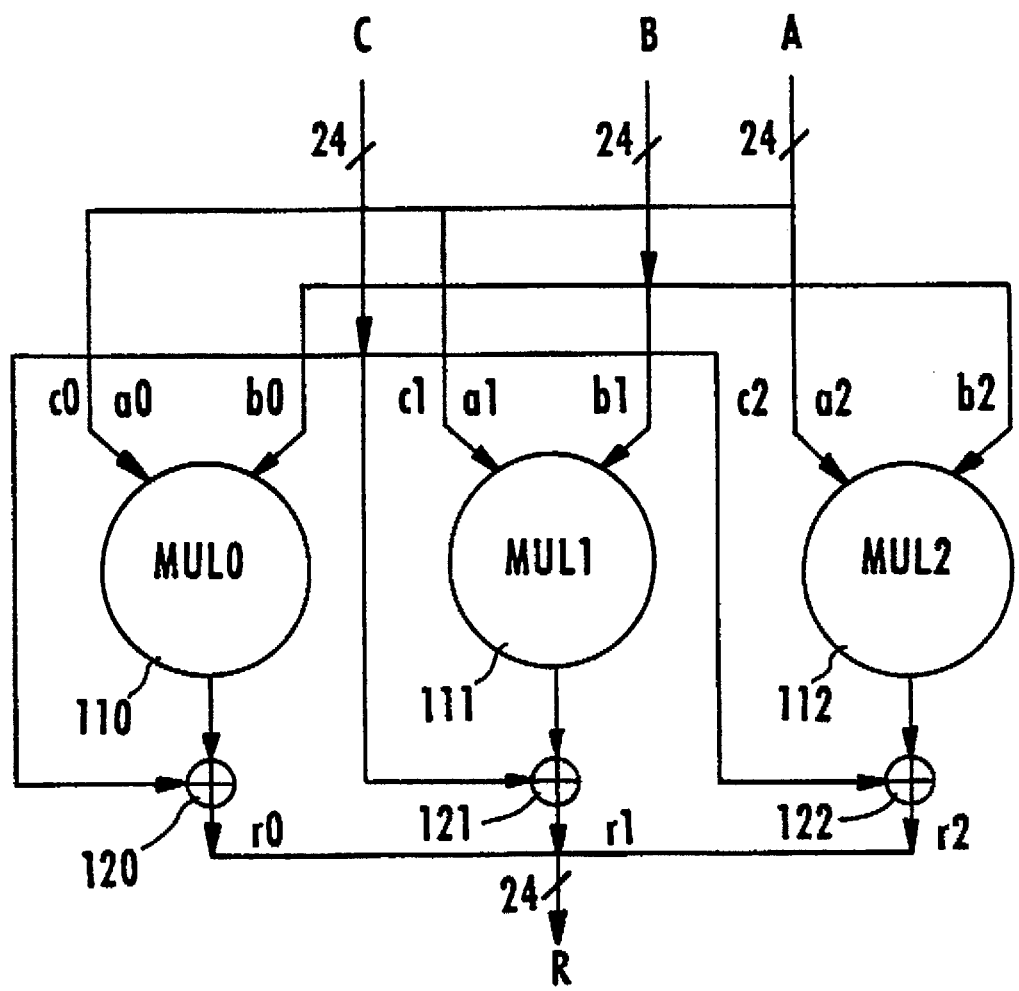
FIG. 7 illustrates the multiplier-adder set MUL3.

FIG. 7 illustrates the multiplier-adder module MUL3 that comprises three multiplier-adder sets MUL0, MUL1 and MUL2 consisting of the multiplier sections 110, 111 and 112, and adder sections 120, 121 and 122, respectively. The module MUL3 performs $ri = ai * bi + ci$, where $i = 0$, 1 and 2, based on finite field arithmetic over the field $GF(2^8)$. It has three 24-bit input buses A, B and C for supplying the signals ai, bi and ci, and one 24-bit output R for transferring the signals ri.

Figure 8:
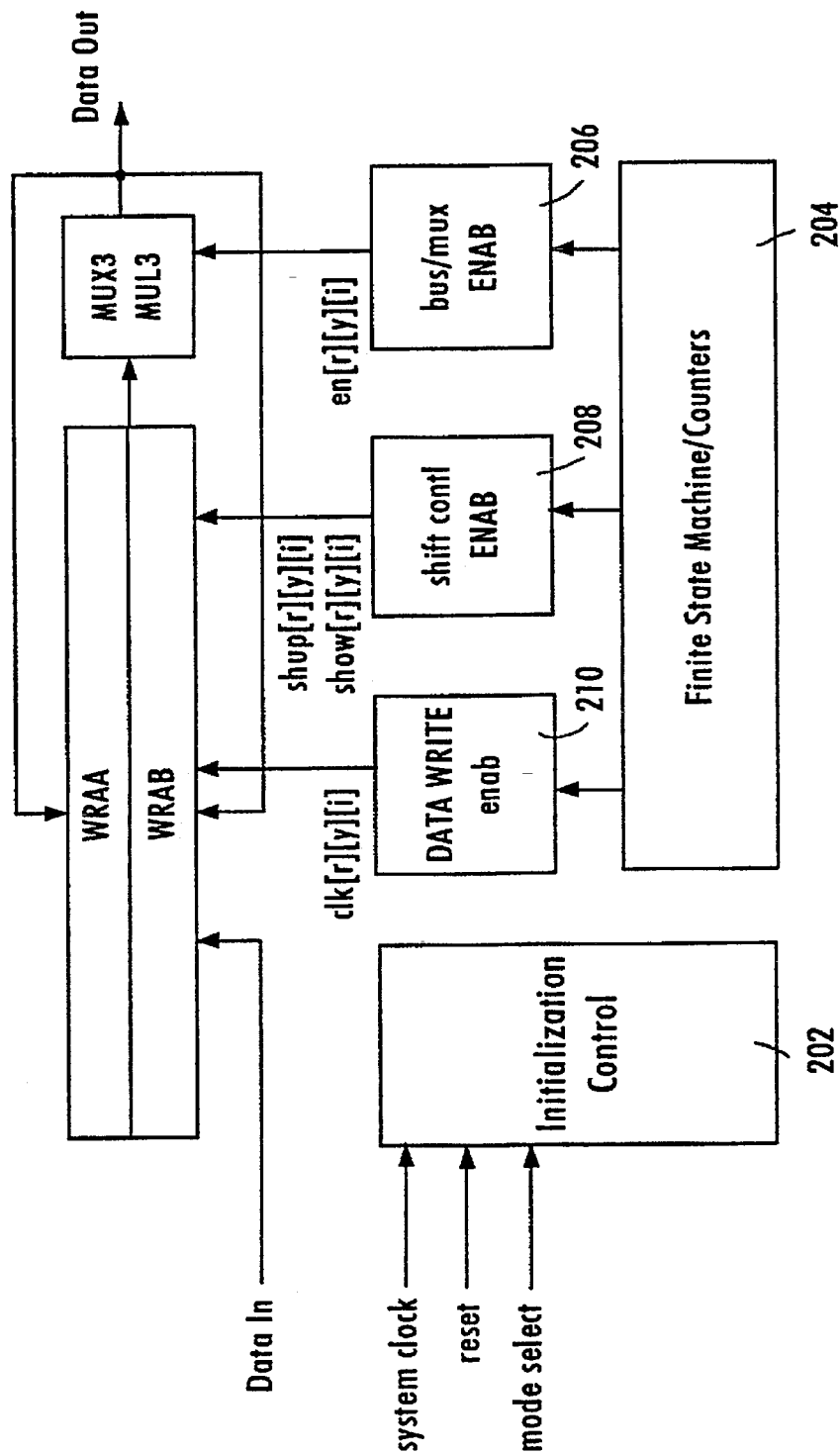
FIG. 8 illustrates the system for controlling the polynomial processing module.

Referring to FIG. 8, the PPM 10 further comprises a control path that allows the WRAA, WRAB, MUX3 and MUL3 to operate in various polynomial operation modes discussed in more detail later. The control path comprises a user interface 202 providing initialization control, a finite state machine 204 including a set of control counters responsive to initialization signals from the user interface 202, a bus/multiplexer enable circuit 206 for selecting the multiplexers of the module MUX3 and controlling the input and output buses of the PPM, a shift control circuit 208 for controlling data transfer in the WRAA and WRAB, and a data write enable circuit 210 that enables data to be written into the WRAA and WRAB.

The user interface 202 receives mode select signals that set polynomial operation modes to be performed. Further, the user interface supply the PPM with a system clock and a reset signal. In response to the signals from the user interface 202, the finite state machine 204 generates timing and control signals supplied to the bus/multiplexer enable circuit 206, shift control circuit 208 and data write enable circuit 210. The bus/multiplexer enable circuit 206 forms enabling signals enr0, enr1, enr2, enr3, enr4 and enr5 supplied to the register arrays RA and RB, and enabling signals eny0, eny1 and eny2 supplied to the register arrays YA and YB to enable data stored in the corresponding cells to be transferred via the buses ro0, ro1 and ro2. Further, the circuit 206 supplies the multiplexers of the module MUX3 with the control signals advisor, readrg and calq to provide access to the multiplier-adder sets MUL0, MUL1 and MUL2 and to the lookup table INV depending on the selected operation mode. The shift control circuit 208 supplies the registers of the WRAA and WRAB with the shift signals shup and shdow to control the up and down data shift in the WRAA and WRAB. The data write enable circuit 210 supplies the register arrays RA and RB with the clock signals clkr0–clkr5, the register arrays YA and YB with the clock signals clky0–clky2, the register arrays QA and QB with the clock signals clkq to write data into the register arrays.

As mentioned above, the PPM 10 performs four basic types of polynomial operations: recursive division and multiplication, polynomial expansion, modulo polynomial multiplication and regular polynomial multiplication. Since the last two multiplication operations are similar, they can be implemented in the same way with minor trivial differences in a control procedure.

For clarity in description of each polynomial function, some terms used below are defined as follows.

An iteration is defined as:
  (a) each pair of division/multiplication processes in an Extended Euclidean algorithm execution, or
  (b) a multiplication process of a first-order polynomial with a higher order polynomial in a polynomial expansion function.

A cycle within each division or multiplication is defined as a loop of division (for one coefficient in a quotient polynomial to obtain a partial remainder) or multiplication (for one coefficient in a multiplier polynomial to obtain a partial product). The number of cycles depends upon the degree and non-zero coefficient of a quotient polynomial or a multiplier polynomial.

A step within a cycle is defined as a process corresponding to a count for multiplication-addition. The number of steps required for a cycle depends upon the degree of the divisor polynomial or multiplicand polynomial.

It should be noted, that the step count within a cycle is drastically reduced by the two-dimensional architecture of the register arrays and by using multiple multiplier-adder sets. The present invention allows the two-dimensional register arrays to be flexibly reconfigure with plural multiplier-adder sets to reduce the number of steps required in a division or multiplication cycle. Three-row register array and three set multiplier implementation provides sufficient speed for optical disk error control. To achieve even higher operation speeds, the number of multiplier-adder sets may be increased. The number of rows in the register arrays is increased (the number of columns is reduced) to match the increased number of multiplier-adder sets, with the same control circuitry. However, the cost of the multiplier-adder sets is very low in compare with the cost of the whole PPM module.

The polynomial operations performed by the PPM 10 are as follows:

i) Recursive Division and Multiplication

This operation allows to compute polynomials $r_i(z)$ and $y_i(z)$ of Equation (1) in the Extended Euclidean algorithm. As can be seen from Equation (1), in each of the iteration i, polynomials $r_i(z)$ are computed by division. Then, polynomials $y_i(z)$ are calculated by multiplication using a quotient polynomial $q_{i-2}(z)$.

The initial polynomials are $y_0(z)=0$, $y_1(z)=1$, $r_0(z)=z^{16}$, and $r_1(z)=S(z)$, where $S(z)$ is a syndrome (error only decoding) or modified syndrome polynomial (error and erasure decoding) with degree less than 16. The control signal advisor is set to 1 (advisor=1) indicating that the value stored in WRAA is a divisor. These initial conditions are established in a transition period and the initial polynomials are sequentially supplied to the register array while the result calculated from previous polynomial function is being shifted out.

i-a) Quotient Calculation

Figure 9:
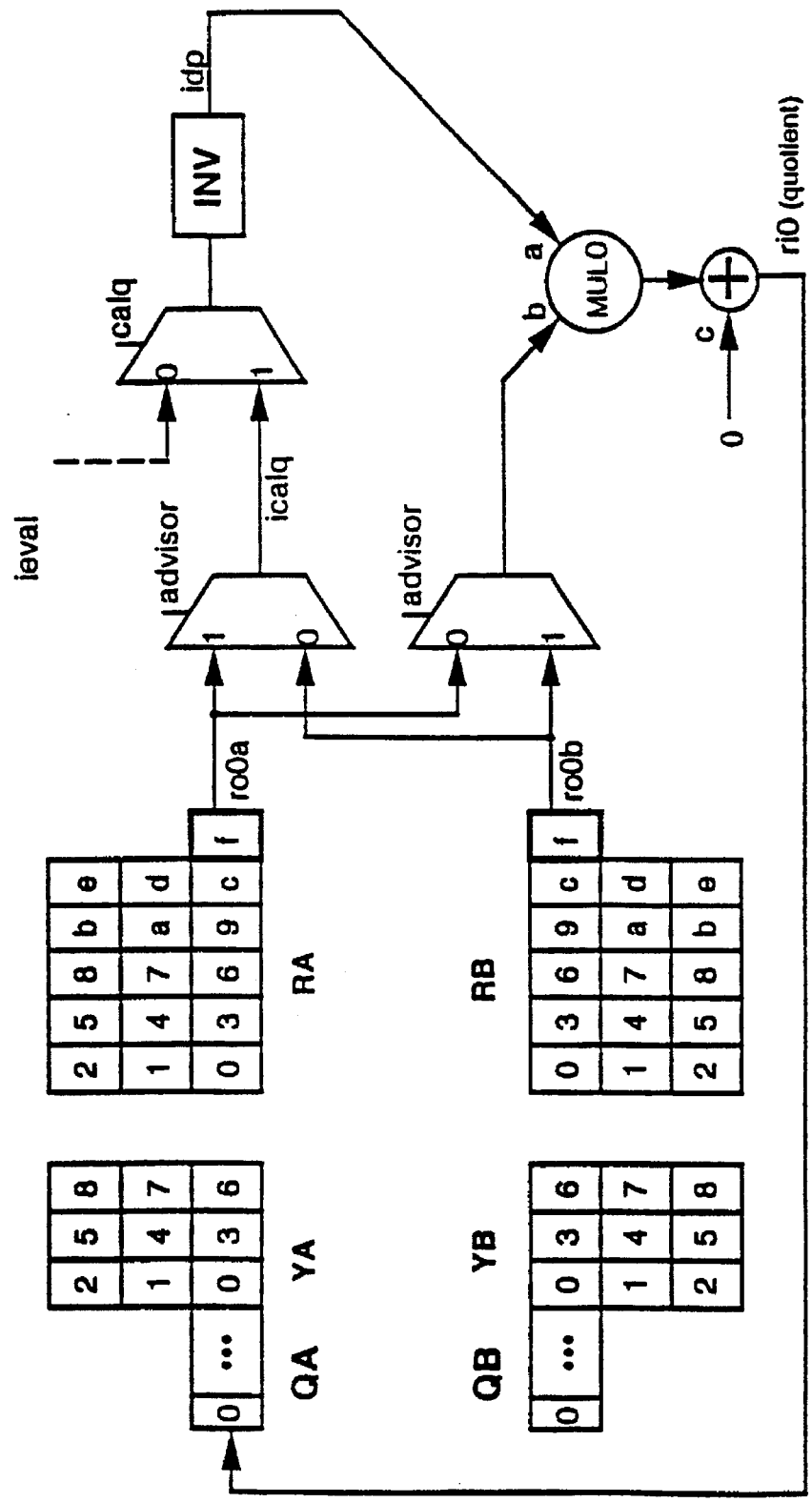
FIGS. 9, 10, 11, and 12 illustrate the recursive division and multiplication mode of the PPM.

Referring to FIG. 9, the first step is to find quotient polynomial $q_0(z)$ and remainder $r_2(z)$ (Equation (1)). Since RA is initially a divisor (advisor=1), the coefficients of $q_0(z)$ are obtained by continuously inverse value lookup of RA[f] and then multiplied by RB[f]. The results (coefficient bytes of the polynomial $q_0(z)$) are saved (up shifted) into register array QA via its cell QA[0]. During the calculation of a quotient polynomial, multiple cycles of RB-divided-by-RA may be required for obtaining all coefficient bytes. These division cycles involve repetitive steps of taking the obtained quotient byte qi, multiply with coefficients of RA, then subtract (exclusive-OR θwith) the product from coefficients of RB. Each of the step operation is shown by the equation $$r_i(z)=RB[i]-RA[i]*q_i=RB[i]\oplus RA[i]*q_i \qquad (6)$$

The number of steps per division relates to the degree of the divisor polynomial (which is in RA in this example).

i-b) Division Operation

Figure 10:
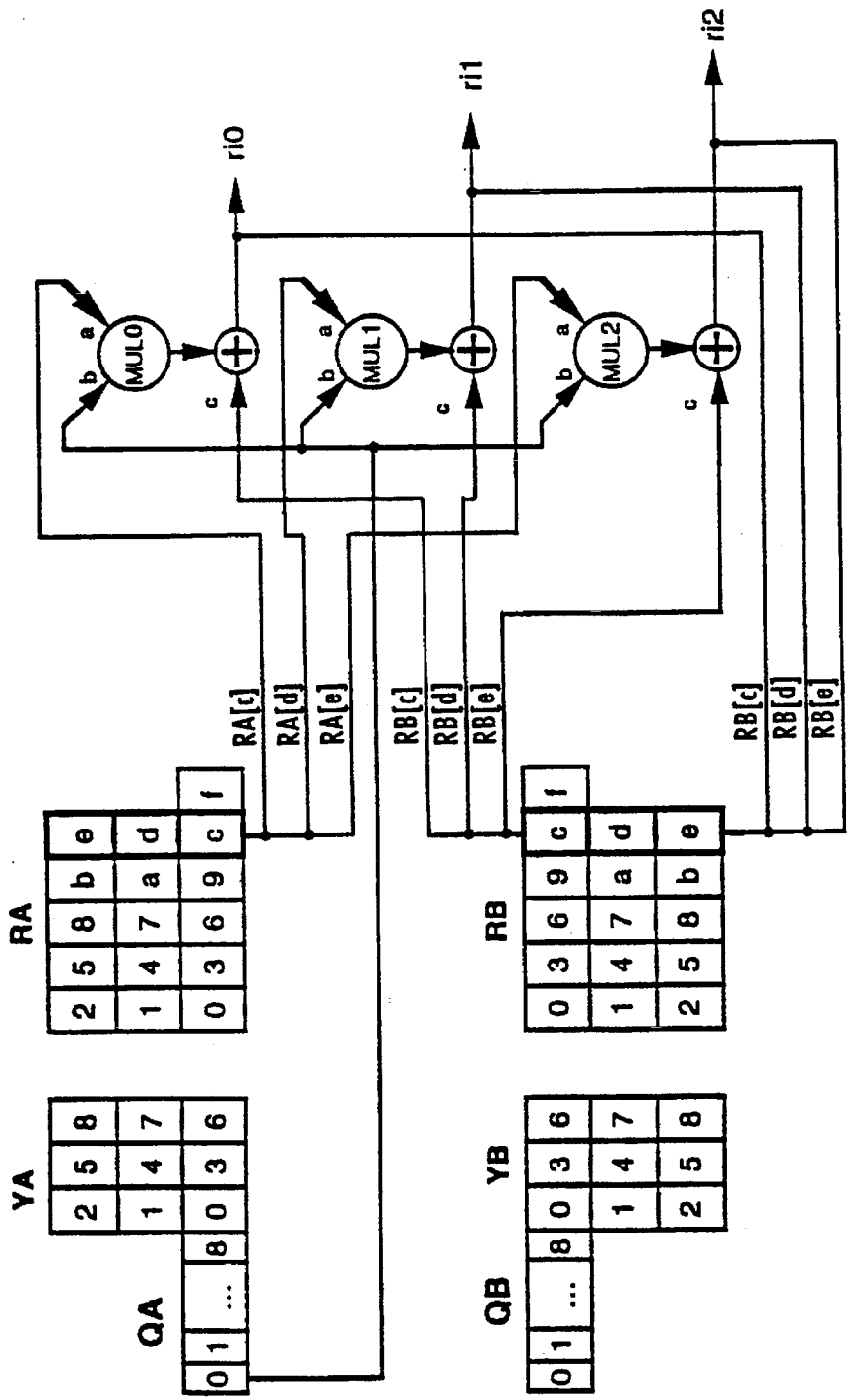

FIG. 10 illustrates the division cycle. With the three-row register array approach, maximum of 5 steps (versus to 15 steps with one row approach) is required to complete a RB/RA polynomial division. The first step is initiated by selecting columns 4 in RA and RB by the signal enr4. Data bytes are enabled to flow into the tristate buses roia and roib where i=0, 1, 2 and pass through MUX3 to the a and c ports of MUL3. The value $q_i$ comes from QA[0] and supplies b port of MUL3. The results are fed back to column 4 of RB by the clock clkr4b. These column-by-column steps repeat until the last coefficient in RA is performed. Then, the data in RB are up-shifted until RB[f] has a non-zero value. The degree of the temporary remainder polynomial in RB is checked to see whether or not more RB/RA division cycles are required. When the degree of RB is still more or equal to that of RA, another division cycle is performed. Thus, the degree of the quotient polynomial increases. Otherwise, the remainder $r_2(z)$ is obtained and the quotient polynomial $q_0(z)$ will readily be used to calculate the error location polynomial in register arrays YA and YB.

i-c) Multiplication Operation

Figure 11:
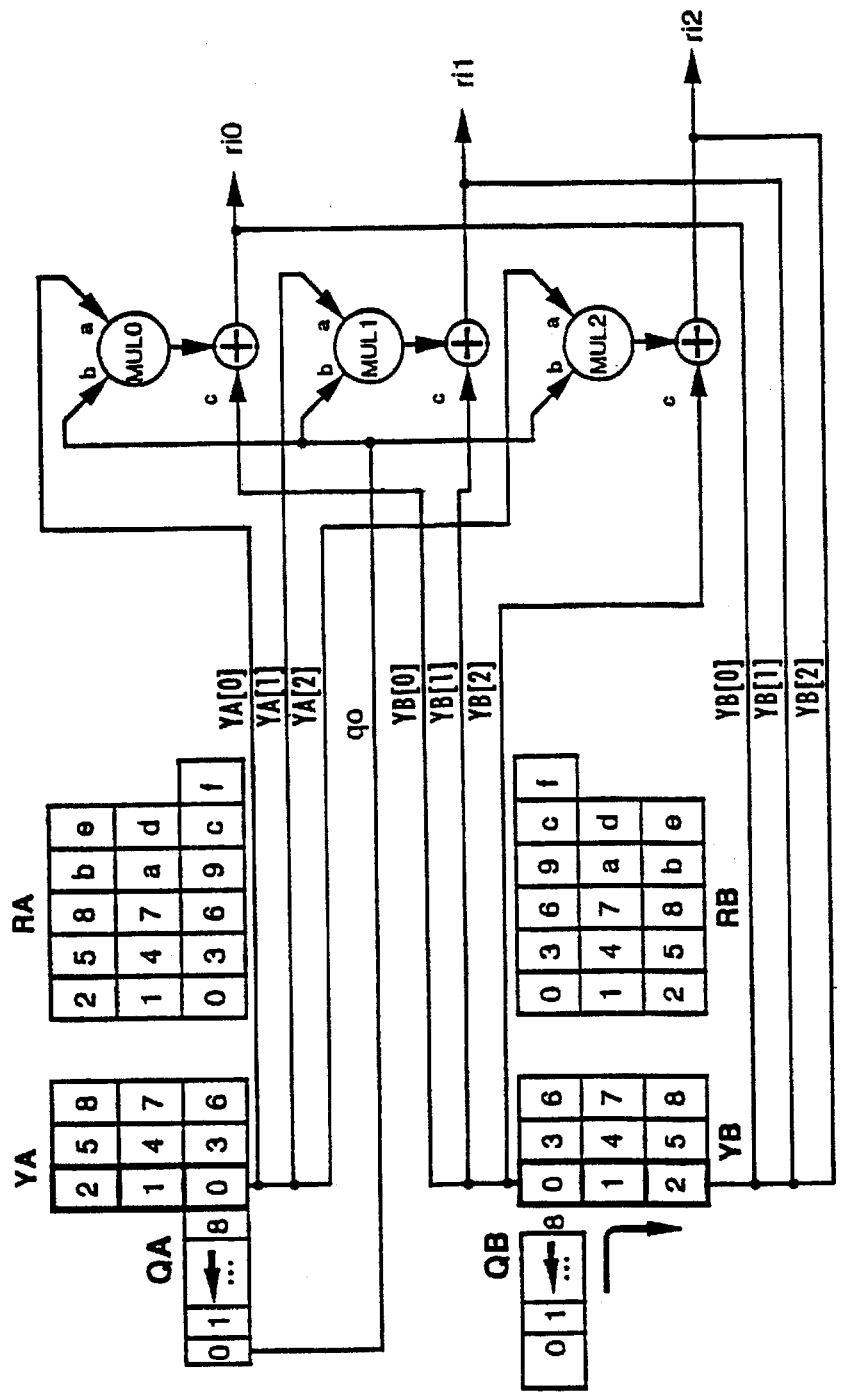

Reference is now made to Equation (1), iteration 0, and FIG. 11 showing the calculation of error location polynomial $\sigma(z)$. Multiplication cycles are required to calculate $y_2(z)$ (in YB) using the previously found $q_0(z)$ stored in QA (higher degree coefficient corresponds to a higher QA byte) and the initialized $y_0(z)$ (in YB) and $y_1(z)$ (in YA). For a multiplication cycle which starts from the Least Significant Byte (LSB) of $q_0(z)$, the first step is initiated from column 0 of YA/YB. The enable signal eny0 allows data in column 0 of YA and YB to reach the bus and be supplied to the a port and c port of MUL3 respectively. The b port is supplied with the quotient coefficient Qa[0] through bus qo. The result in the output of MUL3 goes back to column 0 of YB and overwrite the existing data. Before the second multiplication cycle starts, one byte down-shifts are required for both QA and YB bytes to execute the second coefficient of the multiplier $q_0(z)$. After the second multiplication cycle is performed, the down-shift operation is performed in both QA and YB in the same way as the first one does. It should be noted that quotient bytes 8i (z) in QA becomes less and less and QB serves as a buffer to store part of $y_2(z)$ polynomial (the partial product) due to the down shift from YB. The cycles continue until QA is empty. Then bytes accumulated in buffer QB are required to be up-shifted back to YB. The number of steps in the final up-shifting equals to the degree of quotient polynomial $q_i(z)$. This completes iteration 0 shown in Equation (1).

i-d) Start a New Iteration:

Iteration 1 shown in Equation (1) indicates that the polynomial $r_1(z)$ located in RA becomes a dividend, the polynomial $r_2(z)$ located in RB is a divisor and the polynomial $y_2(z)$ located in YB is a multiplicand. Due to the symmetrical nature of the register arrays WRAA and WRAB, all cycles and steps in the iteration 1 performed in the same fashion as those of iteration 0. The switching is provided by setting the control signal advisor to 0 (advisor=0) and using register latching signals clkri and clkyi for both register arrays.

The number of iterations required for an Extended Euclidean algorithm execution varies depending on the initial polynomials $r_0(z)$ and $r_1(z)$ which is $S(z)$. Thus, the location of the final results $\eta(z)$ and $\alpha(z)$ in either WRAA or WRAB depends on the number of iterations and is indicated by the signal advisor.

Figure 12:
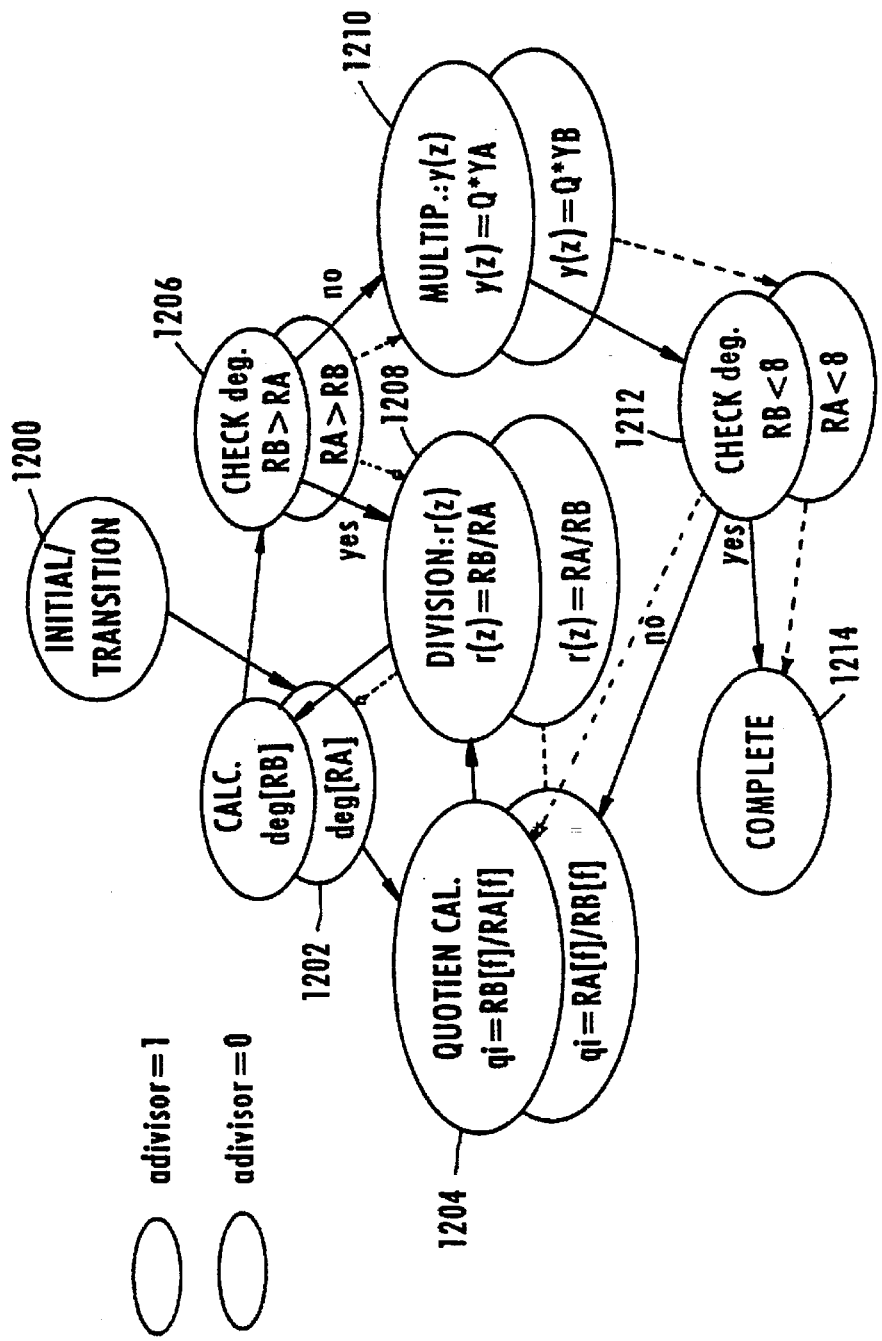

FIG. 12 shows a state diagram summarizing the iterative division and multiplication operation performed by the PPM 10 to implement the Euclidean algorithm. As discussed above, the operation is initiated by the initial transition (block 1200). If the control signal advisor is set to 1, the polynomial in RA is used as a divisor and the polynomial in RB is used as a dividend. The PPM calculates the degree of the polynomial in RA (block 1202) and calculates quotient polynomial $q_i$ equal to RB[f]/RA[f] (block 1204). After checking that the degree of the polynomial in RB is more than that in RA (block 1206), the PPM performs the above-discussed division cycles (block 1208) until the degree of RB is less than the degree of RA. If in block 1206 the degree of RB is determined to be less than the degree of RA, the above-discussed multiplication cycles are performed (block 1210).

As indicated above, the next iteration is performed when the control signal advisor is set to 0 to switch the register arrays WRAA and WRAB. Accordingly, the procedure in blocks 1200–1214 repeats with the polynomial in RA used as a dividend and with the polynomial in RB used as a divisor.

The division/multiplication pairs iterate until the checking procedure in block 1212 indicates that the degree of RB is less than 8. This completes the extended Euclidean algorithm execution (block 1214).

ii) Polynomial Expansion

Using the given erasure location $\alpha_0, \alpha_1, \ldots, \alpha_i$, the erasure polynomial $\sigma_2(z)$ is obtained by expanding all the first-order polynomials $(z-\alpha_i)$. As an example, let the erasure location be $\alpha_0, \alpha_1, \ldots, \alpha_{15}$, $$\sigma_s(Z) = (z+\alpha_o)(z+\alpha_1) \ldots (z+\alpha_{15}) = Z^{16} a_{15} Z^{15} + \ldots + a_0 \quad (7)$$

According to previous definition, the expanding process involves polynomial multiplication iterations. Using the above example, 16 multiplication iterations are required, since 16 first-order polynomials required to be expanded.

The example of the expansion process for the first three components so, $\alpha_0$, $\alpha_1$, and $\alpha_2$ is shown below in Table 1:

TABLE 1

| $z + \alpha_0 \leftarrow$ RB | | $z^2 + (\alpha_1 + \alpha_0)z + \alpha_0\alpha_1 \leftarrow$ RB | |
|---|---|---|---|
| $x\ z + \alpha_1 \quad q_i$ | | $x \qquad\qquad z + \alpha_2 \quad q_i$ | |
| $z\alpha_1 + \alpha_0\alpha_1$ | | $\alpha_2 z^2 + (\alpha_1\alpha_2 + \alpha_0\alpha_2)z + \alpha_0\alpha_1\alpha_2$ | |
| $z^2 + z\alpha_0 \leftarrow$ | RA | $z^3 + (\alpha_1 + \alpha_0)z^2 + \alpha_0\alpha_1 z \leftarrow$ | RA |
| $z^2 + (\alpha_1 + \alpha_0)z + \alpha_0\alpha_1$ | RA/RB | $z^3 + Az^2 + Bz + C$ | RA/RB |

It should be noted that A, B and C are summed coefficients and the coefficients marked by "<" in each iteration are identical, although the degree of the polynomials are different. This leads to an efficient utilization of the shifting capability in the register array architecture. The link of concept and implementation is stated as follows:

After the first expansion for $\alpha_0$ (multiplication of $(z+\alpha_0)$ and 1; $\delta_i$ is a multiplier, when advisor=0), the polynomial $(z+\alpha_0)$ is stored (overwritten) to both RA and RB. The polynomial in RA should be shifted-up by one byte to become $(z^2+z\alpha_0)$ before the second iteration starts. In the second iteration (RB is a multiplicand, advisor=0), expansion for $\alpha_1$ is performed. Then, the result is stored into both RA and RB. In the same fashion the iterations continue till the last erasure location.

Figure 13:
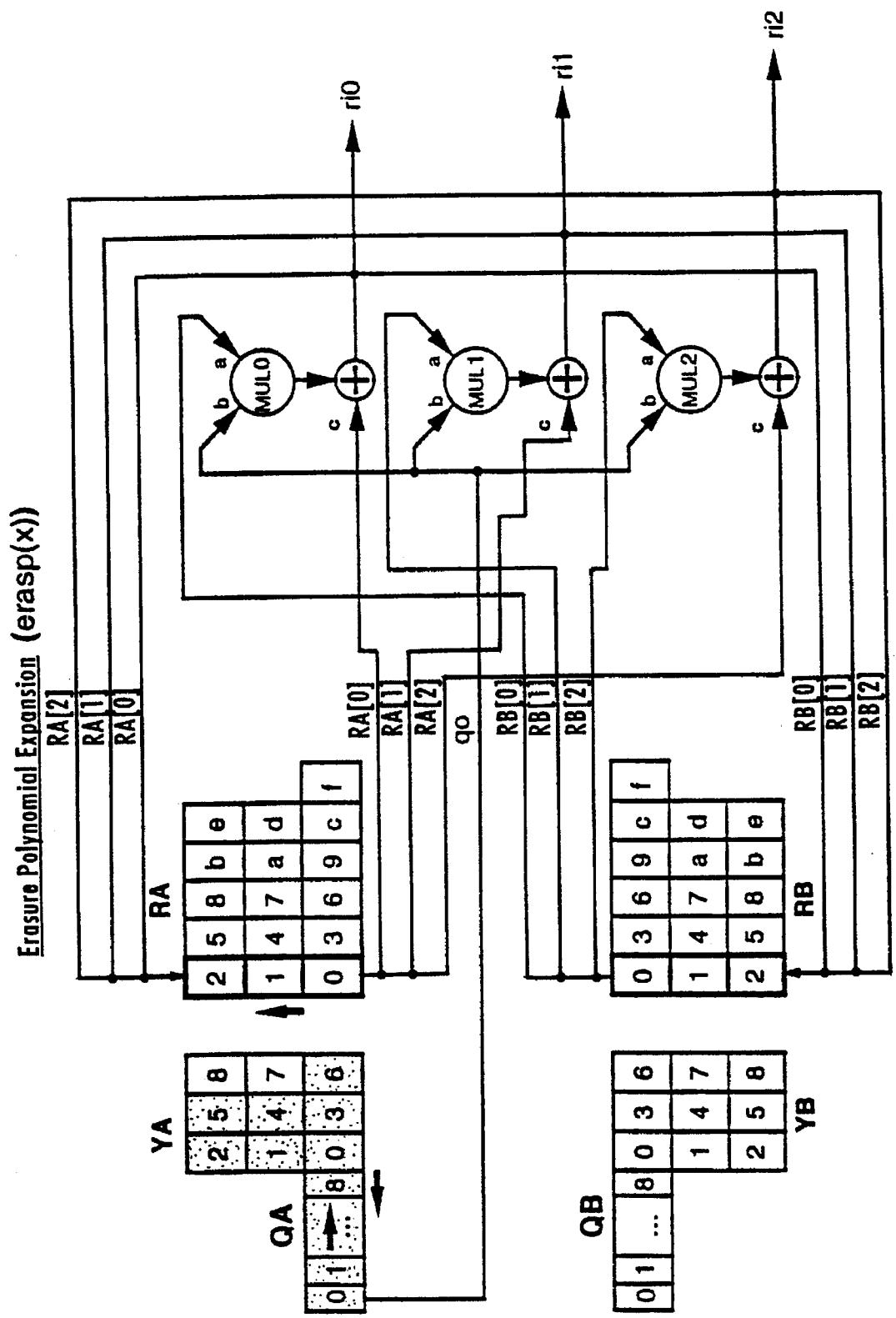
FIGS. 13–14 illustrate the polynomial expansion mode of the PPM.
Figure 14:
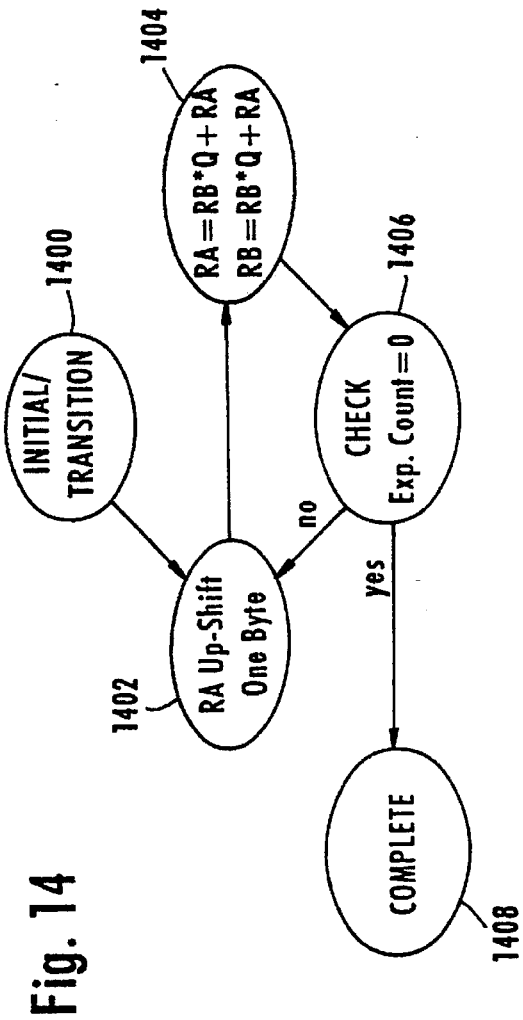

Reference is now made to FIG. 13 showing actual implementation of this function by using the multiple sets of multiplier-adder and register arrays architecture, and to FIG. 14 showing a state diagram of the polynomial expansion.

ii-a) Initialization:

The initial conditions are set in a transition period (block 1400) so that all the erasure location bytes $\alpha_i$ (maximum i is 15 in this particular application) are sequentially shifted-up into QA and YA (if i is greater than 9) through the entrance qin to QA[0] and RA[0] and RB[0] are set to 1 in one clock step. The signal advisor is set to 0, which means that QA/YA is a multiplier.

ii-b) Polynomial Expansion:

For i erasure location bytes, i iterations are required in an expansion process. Since the multiplier polynomial in the expansion process is always a first-order polynomial, it takes 2 cycles for each iteration. However, each iteration takes only 1 cycle to process due to the fact that the coefficient of z is always 1. Furthermore, the number of steps within a cycle increases by 1 per iteration. As a result, the degree of the multiplicand polynomial in RB increases.

Assume that the signal advisor is set to 0 and $\alpha_1$ is to be expanded. Both RA and RB contain the same polynomial $z+\alpha_0$, which is generated from previous iteration. Since the polynomial RB becomes a multiplicand with degree of 1, two steps per cycle are required. First cycle can be performed by a one byte up-shift in RA (block 1402) due to the fact that the coefficient of z of the multiplier q is 1. The second cycle (block 1404) comprises the steps of multiplying qo with RB[j], summing with RA[j], and writing the results of MUL3 rij back to both RA[j] and RB[j], where j=0, 1, 2 (equivalent to RA=RB*$q_i$+RA).

FIG. 13 shows a step where data located in column 0 of both RA and RB are calculated. The column enabling is performed by the signal enr0 and the column writing is provided by clkr0.

For each expanding iteration, erasure location bytes stored in QA register array are down-shifted by one byte. QA[0] is always connected to the bus qo. When an expansion count is determined to be 0 (block 1406), the polynomial expansion operation completes (block 1408).

iii) Polynomial Multiplication

In an error control application, polynomial multiplication is used to calculate the modified syndrome polynomial $S_z(z)$ and error location polynomial $\sigma_m(z)$ from their original polynomials $S(z)$ and $\sigma(z)$ with an erasure polynomial $\sigma_z(z)$. This is shown in the following equations $$S_s(z) = \sigma_s(Z)*S(z) \bmod z^{16}, \quad (8)$$

$$\sigma_m(z) = \sigma_s(z)*\sigma(z), \quad (9)$$

where $\sigma_e(z)$ is an erasure polynomial with maximum degree of 16. Since the degree of am(z) is less than 17 due to the fact that $\deg[\sigma_e(z)]=\epsilon$ and $\deg[\sigma(z)]=\lfloor(16-\epsilon)/2\rfloor$ and the degree of $S_z(z)$ is less than 16, the same multiplication algorithm and control can be applied to both functions. Note that the modulo $z^{16}$ function shown in Equation (8) can easily be implemented by discarding the coefficients belonged to $z^{16}$ and higher. The proposed register array architecture performs this function by treating the final data, which is stored in the 16-byte register RA or RB, as the modulo result.

The multiplication process involves a plurality of multiplication cycles. The number of the required cycles depends on the number of non-zero coefficients of the multiplier polynomial (which is $\sigma_e(z)$ in this case). The number of steps in a cycle depends on the degree of the multiplicand.

An example of the polynomial multiplication when advisor is set to 0 is shown below in Table 2.

Hence, the register arrays RB keeps the multiplicand (S(z) or $\sigma(z)$), QA/YA keeps the multiplier polynomial ($\sigma_e(z)$ in this case), the final results ($S_e(z)$ or $\sigma_m(z)$) will be stored in RA. As $\sigma/e(z)$ has degree of 8, the multiplication is performed in 9 cycles. Each cycle comprises 10 steps ($S(z)$ or $\sigma(z)$ has degree of 9). To accumulate partial product results of each cycle into RA correctly, RB is up-shifting by one byte at a time for each cycle after the first cycle and performs byte multiplication steps within a cycle. In the same fashion the iterations continue till the last coefficient of $\sigma_e(z)$ in QA.

TABLE 2

$$z^9 + a_8z^8 + a_7z^7 + \ldots + a_1z + a_0 \leftarrow RB$$
$$\times \quad b_8z^8 + b_7z^7 + \ldots + b_1z + b_0 \leftarrow QA$$
$$\overline{b_0z^9 + c_{8,0}z^8 + c_{7,0}z^7 + \ldots c_{1,0}z + c_{0,0}}$$
$$b_1z^{10} + c_{9,1}z^9 + c_{8,1}z^8 + \ldots + c_{1,1}z^2 + c_{0,1}z \leftarrow \text{SHIFT-UP}$$
$$\ldots$$
$$\overline{xxx^{-}C_{15}z^{15} + C_{14}z^{14} + \ldots + C_1z + C_0 \leftarrow RA}$$

Figure 16:
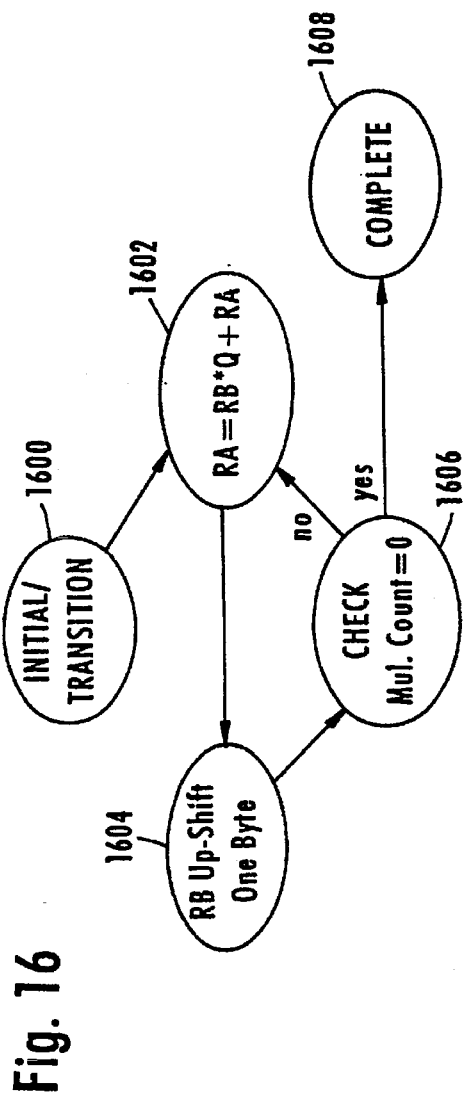
FIGS. 15–16 illustrate the polynomial multiplication mode of the PPM.
Figure 15:
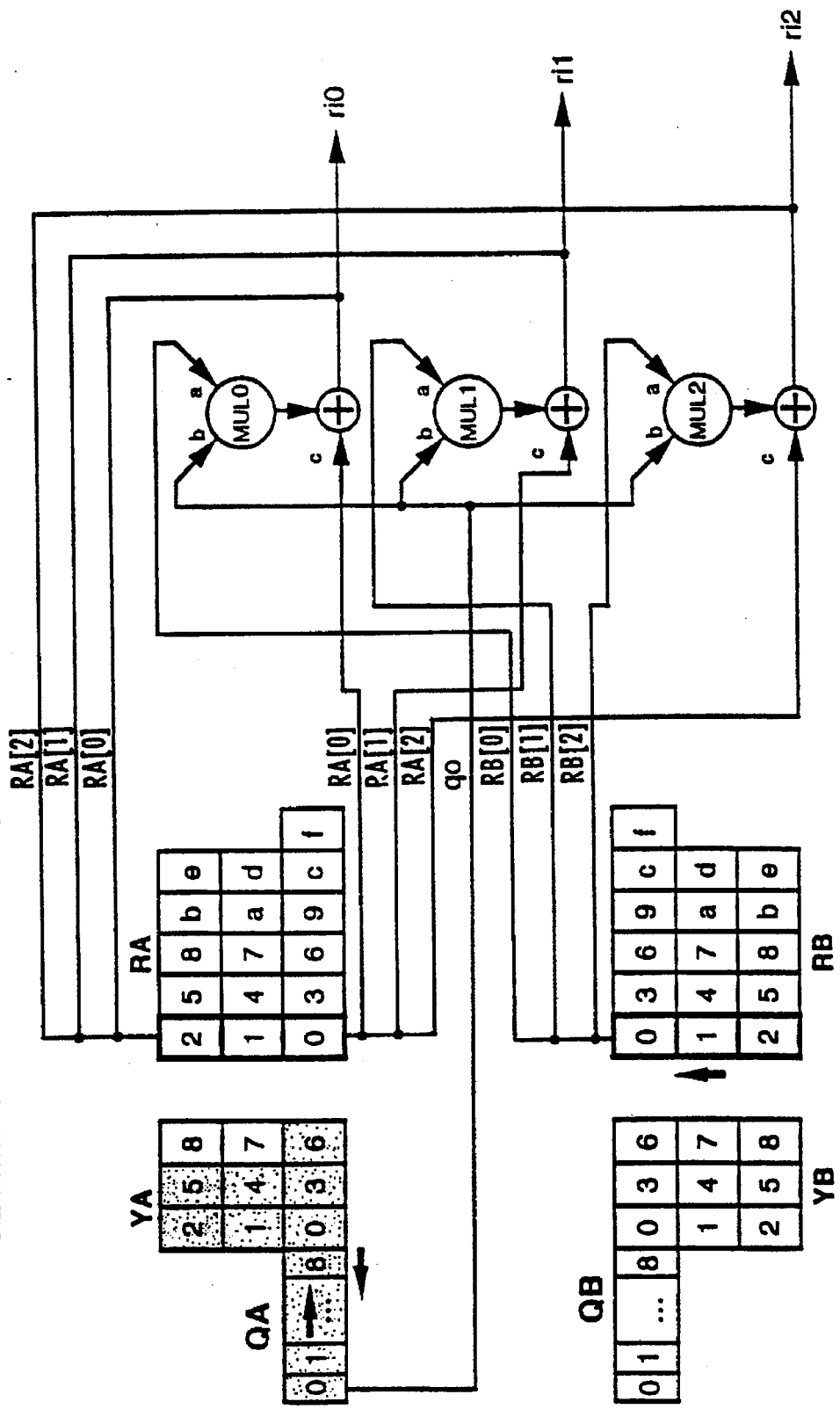

Reference is now made to FIG. 15 showing actual implementation of the polynomial multiplication procedure by using the multiple sets of multiplier-adder and register arrays architecture, and to FIG. 16 showing a state diagram of the polynomial multiplication.

iii-a) Initialization

The initial conditions are set in a transition period (block 1600) so that the coefficients of the expanded erasure polynomial bytes (maximum bytes is 16 in this particular application) are sequentially shifted-up into QA and YA (when the byte count is greater than 9) through the entrance 'qin' to QA[0].

The multiplicand may be stored in RA or RB depending on which polynomial function is chosen. In the case of calculating modified syndrome polynomial $S_e(z)$, the syndrome coefficients in $S(z)$ is sequentially loaded into RB through the entrance 'rinb' into RB[0] in a transition period, RA is reset to 0. In the case of calculating modified error location polynomial $\sigma_m(z)$, Euclidean result $\sigma(z)$ in YA or YB is shifted-up into RA or RB (depending on advisor=0 or 1) in a transition period.

iii-b) Polynomial Multiplication:

For an ith-order erasure polynomial served as a multiplier, an iteration that includes i+1 cycles is required. The step count in a cycle depends on the degree of the multiplicand in RA or RB. As shown in FIG. 15, the erasure location polynomial $\sigma_e(z)$ is in QA and YA, $S(z)$ (or $\sigma(z)$) is in RB when advisor=0. In each cycle, the multiplier byte in QA[0] is connected to port b of the MUL3 through bus qo, a column of RB is connected to port a, a column of RA is coupled to port c. The result from MUL3 overwrites the same column of RA to complete the operation RA=RB*q$_i$+RA (block 1602). The steps are performed for each column until all the multiplicand bytes in RB are executed. Before a new cycle, the next LSB in the multiplier (in QA/YA) is moved to QA[0] by a one clock down-shifting, and the multiplicand bytes in RB are up-shifted by one byte (block 1604). Then a new cycle starts. The cycles repeat until a multiplication count is set to 0 (block 1606) to indicate that all multiplier bytes in QA/YA are shifted out. The result might grow and overflow the 16-byte array. However, in the case of calculating $S_z(z)$ the data left in the array become the residue of the modulo $z^{16}$ operation automatically without any extra treatment. In the case of calculating $\sigma_m(z)$, due to the fact that $\sigma_m(z)$ has maximum degree 16, only its derivative $\sigma_m'(z)$ is used in other decoding block. The overflown coefficient bytes $C_{16}$ for $z^{16}$ can be ignored based upon the fact that $16*C_{16}=0$ in $GF(2^8)$.

iv) Output Scheme of the Array Architecture

Figure 17:
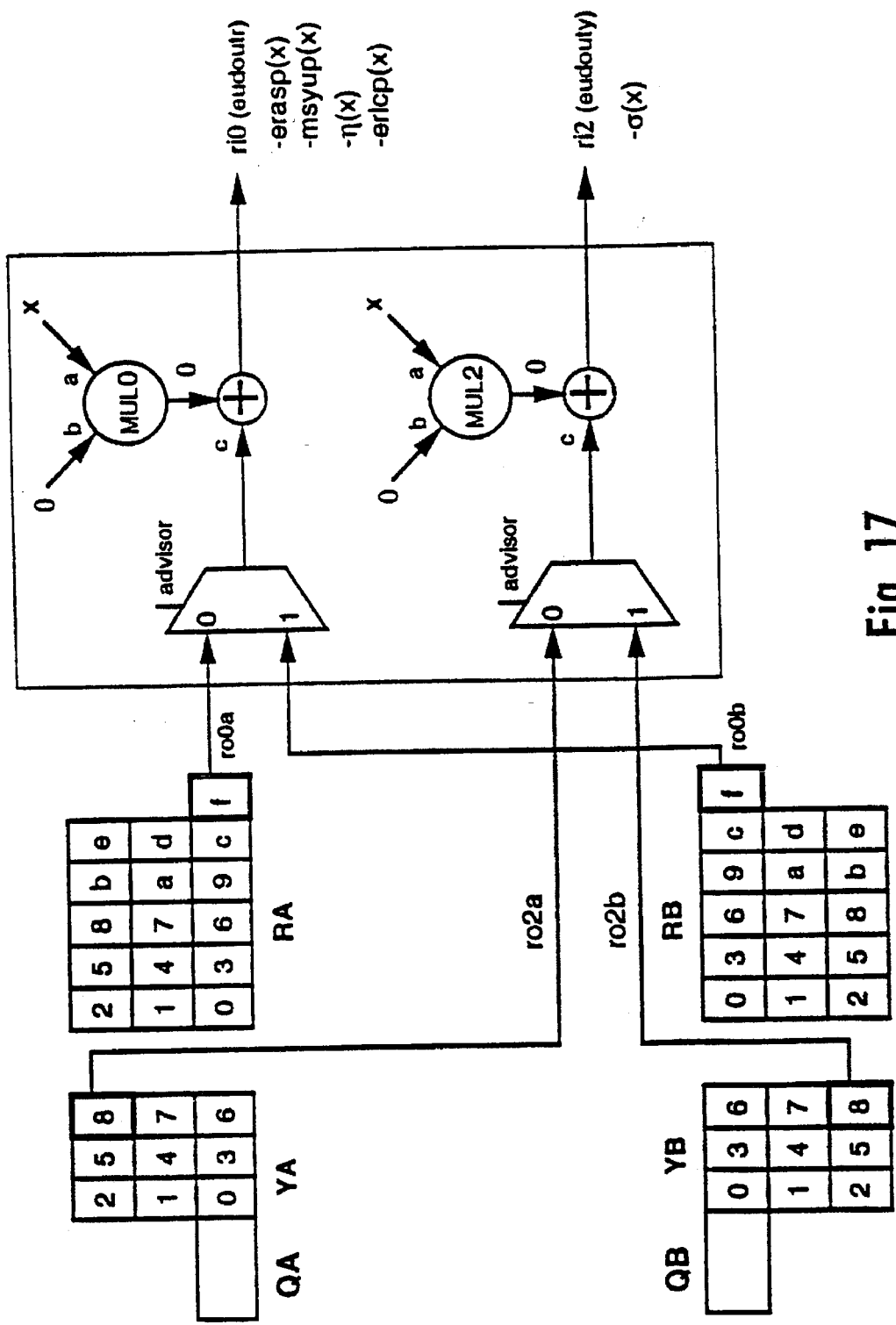
FIG. 17 is a diagram illustrating the data output path of the PPM.

The calculated result is supplied into the pair of working register arrays WRAA and WRAB after the completion of each function. Register RA stores erasure polynomials, modified syndrome and error location polynomials. The error value polynomial $\eta(z)$ may be stored in either RA or RB depending on advisor=0 or 1. Similarly, the error location polynomial $\sigma(z)$ is in YA or YB depending on advisor=0 or 1. To extract these resultant polynomials out of the PPM module, the tri-state channel buses ro0$a$ and ro2$a$, ro0$b$ and ro2$b$ are used to supply data to MUX3 and MUL3. Then, the output of MUL0 and MUL2 are disabled. The coefficients of a polynomial through c ports of the MUL3 are supplied to the buses ri0 and ri2. FIG. 17 shows that the most significant byte (MSB) of a polynomial supplied to the bus from RA[f] or RB[f] and from YA[8] or YB[8]. The inputs b of the three-set multiplier MUL3 are set to 0 such that data can be directly supplied to ri0 and ri2.

Step Reduction Scheme

During the polynomial multiplication or division cycles in the two-dimensional register array, the operations for all multiplier bytes or divisor bytes involve multiple steps. The control logic is more simple, however unnecessary step counts are included if the multiply-accumulate function is performed in fixed number of steps, for example, the operations in RA or RB require 6 steps (for 6 columns) and 3 steps in YA or YB (3 columns). To minimize the number of steps required in a multiplication cycle, the location of a polynomial coefficients in the register array is dynamically monitored to activate the multiplication step from the right columns to avoid unnecessary steps. Two examples of the Euclidean algorithm cycle are illustrated in FIG. 18. In Example 1, it takes 5 steps (from columns 4, 3, 2, 1, 0) to calculate the partial remainder from $r(z)$, and 1 step (column 0) to calculate the partial product from $y(z)$. In Example 2, it takes 3 steps (columns 4, 3, 2) for the $r(z)$ and 3 steps (columns 0, 1, 2) for the $y(z)$.

Based on the polynomial functions, the step reduction scheme is implemented as follows.

i) Recursive Division and Multiplication

As discussed above, the Extended Euclidean algorithm iteratively generates $r_i(z)$ in division operations and $y_i(z)$ in multiplications. Since the degree of the remainder polynomial $r_i(z)$ decreases, the number of the columns in register array RA/RB to store the effective coefficients also decreases. As a result, the number of steps (step count) required to perform the multiplication in each cycle may be decreased. In the case of calculating $y_i(z)$, since its degree increases after each multiplication cycle, the step count increases. The following tables show the mapping function between polynomial degree and the step count. In particular, Table 3 is the step mapping table for calculating $\eta(z)$ ($r_i(z)$), and Table 4 is the step mapping table for calculating $\sigma(z)$ ($y_i(Z)$).

TABLE 3

| Degree of Multiplicand Polynomial | Step Count Required |
|---|---|
| 15, 14, 13 | 5 (Column Order: 4, 3, 2, 1, 0) |
| 12, 11, 10 | 4 (Column Order: 4, 3, 2, 1) |
| 9, 8 | 3 (Column Order: 4, 3, 2) |

TABLE 4

| Degree of Divisor Polynomial | Step Count Required |
|---|---|
| 0, 1, 2 | 1 (Column Order: 0) |
| 3, 4, 5 | 2 (Column Order: 0, 1) |
| 6, 7, 8 | 3 (Column Order: 0, 1, 3) | ii) Polynomial Expansion

As discussed above, the degree of erasure polynomial increases during the expanding iterations. The partial product in RB acts as a multiplicand. Table 5 shows the mapping function between polynomial degree and the step count for calculating an erasure polynomial.

TABLE 5

| Degree of Multiplicand Polynomial | Step Count Required |
|---|---|
| 0, 1, 2 | 1 (Column Order: 0) |
| 3, 4, 5 | 2 (Column Order: 1, 0) |
| 6, 7, 8 | 3 (Column Order: 2, 1, 0) |
| 9, 10, 11 | 4 (Column Order: 3, 2, 1, 0) |
| 12, 13, 14 | 5 (Column Order: 4, 3, 2, 1, 0) |
| 15 | 6 (Column Order: 5, 4, 3, 2, 1, 0) | iii) Polynomial Multiplication

During the calculation of modified syndrome polynomial, the multiplicand polynomial (which is usually a syndrome polynomial S(z) of degree 15) is up-shifted by one byte per cycle. Thus, the number of effective bytes in RB decreases. As a result, the step counts in a cycle also decreases. Table 6 shows the mapping function between polynomial degree and the step count for calculating a modified syndrome polynomial.

TABLE 6

| Effective Byte of Multiplicand Polynomial | Step Count Required |
|---|---|
| 16, 15, 14 | 6 (Column Order: 5, 4, 3, 2, 1, 0) |
| 13, 12, 11 | 5 (Column Order: 5, 4, 3, 2, 1) |
| 10, 9, 8 | 4 (Column Order: 5, 4, 3, 2) |
| 7, 6, 5 | 3 (Column Order: 5, 4, 3) |
| 4, 3, 2 | 2 (Column Order: 5, 4) |
| 1 | 1 (Column Order: 5) |

In the case of calculating a modified error location polynomial, further step reduction may be achieved since the degree of an error location polynomial $\sigma(z)$ could be less than 15. It means that the columns involved in the multiplication operation keep the effective coefficient of $\sigma(z)$. Table 7 shows the relationship between the location of the LSB of the multiplicand and the required number of steps (assume multiplicand polynomial is in RB) for calculating a modified error location polynomial.

TABLE 7

| Location of LSB of multiplicand polynomial | Step Count Required |
|---|---|
| 1) $\deg(\sigma(z)) \geq 7$ | |
| RB[0], RB[1] | 3 (Column Order: 0, 1, 2) |
| RB[2] | 4 (Column Order: 0, 1, 2, 3) |
| 2) $\deg(\sigma(z))=6$ | |
| RB[0], RB[1], RB[2] | 3 (Column Order: 0, 1, 2) |
| RB[3], RB[4] | 3 (Column Order: 1, 2, 3) |
| 3) $\deg(\sigma(z))=5$ | |
| RB[0] | 2 (Column Order: 0, 1) |
| RB[1], RB[2] | 3 (Column Order: 0, 1, 2) |
| RB[3] | 2 (Column Order: 1, 2) |
| RB[4], RB[5] | 3 (Column Order: 1, 2, 3) |
| RB[6] | 2 (Column Order: 2, 3) |
| 4) $\deg(\sigma(z))=4$ | |
| RB[0], RB[1] | 2 (Column Order: 0, 1) |
| RB[2] | 3 (Column Order: 0, 1, 2) |
| RB[3], RB[4] | 2 (Column Order: 1, 2) |
| RB[5] | 3 (Column Order: 1, 2, 3) |

TABLE 7-continued

| Location of LSB of multiplicand polynomial | Step Count Required |
|---|---|
| RB[6], RB[7] | 2 (Column Order: 2, 3) |
| RB[8] | 3 (Column Order: 2, 3, 4) |
| 5) $\deg(\sigma(z))=3$ | |
| RB[0], RB[1], RB[2] | 2 (Column Order: 0, 1) |
| RB[3], RB[4], RB[5] | 2 (Column Order: 1, 2) |
| RB[6], RB[7], RB[8] | 2 (Column Order: 2, 3) |
| RB[9], RB[a] | 2 (Column Order: 3, 4) |
| 6) $\deg(\sigma(z))=2$ | |
| RB[0] | 1 (Column Order: 0) |
| RB[1], RB[2] | 2 (Column Order: 0, 1) |
| RB[3] | 1 (Column Order: 1) |
| RB[4], RB[5] | 2 (Column Order: 1, 2) |
| RB[6] | 1 (Column Order: 2) |
| RB[7], RB[8] | 2 (Column Order: 2, 3) |
| RB[9] | 1 (Column Order: 3) |
| RB[a], RB[b] | 2 (Column Order: 3, 4) |
| RB[c] | 1 (Column Order: 4) |
| 7) $\deg(\sigma(z))=1$ | |
| RB[0], RB[1] | 1 (Column Order: 0) |
| RB[2] | 2 (Column Order: 0, 1) |
| RB[3], RB[4] | 1 (Column Order: 1) |
| RB[5] | 2 (Column Order: 1, 2) |
| RB[6], RB[7] | 1 (Column Order: 2) |
| RB[8] | 2 (Column Order: 2, 3) |
| RB[9], RB[a] | 1 (Column Order: 3) |
| RB[b] | 2 (Column Order: 3, 4) |
| RB[c], RB[d] | 1 (Column Order: 4) |
| RB[e] | 2 (Column Order: 4, 5) |

There accordingly has been described a finite field polynomial processing module (PPM) capable of performing several polynomial functions using a switching control scheme. The PPM incorporates a set of register arrays to prevent a memory access bottleneck. Results of one function are used in performing another function without intermediate saving into a memory. Two-dimensional data movement within the register arrays provides high speed and versatile polynomial operations. In particular, vertical shifting enhances functional variety, and horizontal shifting allows simultaneous multiprocessing to be performed. The architecture of multiple multiplier along with two-dimensional register array configuration is scalable to accommodate various throughput. In accordance with speed requirements, it may be configured as n x m array with n multipliers or p×(nm/p) array with p multipliers, where n, m and p are integers. The circuit simulation using Verilog simulator shows that at 16.7 MHZ system clock the disclosed PPM is able to decode a 1000 byte sector of data with mixed errors and erasures for 224 µs. For error only cases, it takes 174.6 µs for a sector. Thus, the disclosed PPM makes it possible to implement a high speed error control system.

In this disclosure, there is shown and described only the preferred embodiment of the invention, but it is to be understood that the invention is capable of changes and modifications within the scope of the inventive concept as expressed herein.

I claim:

1. Apparatus for correcting errors in corrupted data comprising:

register sets for storing Galois field polynomial data representing the corrupted data, each of said register sets including register arrays with cells arranged in rows and columns so as to provide horizontal and vertical data shifts along the rows and the columns, a plurality of multiplier-adder sets responsive to said register sets for performing multiplication and addition of said polynomial data read from said register sets, control means for supplying said register sets and said multiplier-adder sets with control signals to control the horizontal and vertical data shifts in said register arrays, and to enable said multiplier-adder sets to provide recursive multiplication and recursive division of said polynomial data, the same multiplier-adder sets performing the recursive multiplication and the recursive division, and means responsive to said multiplier-adder sets for locating and correcting the errors, wherein each of said register sets comprises a vertical shift register array arranged in a plurality of rows and columns, and a horizontal shift register array arranged in a single row, said vertical shift register array provides bidirectional vertical data shift along the columns, and said horizontal shift register array provides bidirectional horizontal data shift along the row.

2. The apparatus of claim 1, wherein said multiplier-adder sets are connectable to said vertical and horizontal shift register arrays.

3. The apparatus of claim 2, further comprising multiplexing means for coupling said shift register arrays to said multiplier-adder sets.

4. The apparatus of claim 1, wherein said control means comprise user interface means for receiving initialization signals to set the apparatus to a prescribed mode of operation.

5. The apparatus of claim 4, wherein said control means comprise a finite state machine responsive to said initialization signals for supplying enabling signal to control data in said register means.

6. The apparatus of claim 1, wherein the multiplier-adder sets that perform the recursive multiplication and the recursive division, further execute polynomial expansion and polynomial multiplication of said polynomial data.

7. A system for determining errors and erasures in data read from an optical disk memory means, comprising:

a plurality of registers responsive to the read data for storing signals indicating occurrence of the errors and erasures, said plurality of registers including shift register arrays with cells arranged in rows and columns so as to provide horizontal and vertical data shifts along the rows and the columns, a plurality of multiplier-adder sets connectable to said registers for generating signals indicating location of the errors and their value in a first mode of operation, and for generating signals indicating value of erasures in a second mode of operation, and a control circuit coupled to said shift register arrays and said multiplier-adder sets for controlling the horizontal and vertical data shifts in said shift register array and switching said multiplier-adder sets between said first and second modes of operation, wherein said plurality of registers comprises vertical shift register arrays arranged in rows and columns, and a horizontal shift register array arranged in a single row, and said control circuit comprises a finite state machine for supplying said vertical and horizontal shift register arrays with a shift control signal to control bidirectional shifting of the stored data in a vertical direction and bidirectional shifting of the stored data in a horizontal direction along the columns and the rows.

8. The system of claim 7, wherein said multiplier-adder sets performs recursive division and multiplication of the signals stored in said registers in said first mode of operation, and performs polynomial expansion of the signals stored in said registers in said second mode of operation.

9. The system of claim 8, wherein said multiplier-adder sets performs polynomial multiplication in a third mode of operation.

10. The system of claim 9, wherein said control circuit provides signal paths between said registers and said multiplier-adder sets switchable to provide switching between said first, second and third modes of operation.

11. The system of claim 7, further comprising a multiplexer for supplying each of the multiplier-adder sets with the signals from the corresponding registers in accordance with a prescribed mode of operation.

12. The system of claim 11, wherein said multiplexer supplies the corresponding register with an output signal of the multiplier-adder sets to store an intermediate result of operations.

13. The system of claim 11, wherein said multiplexer provides data paths in accordance with each said prescribed mode of operation.

14. The system of claim 11, wherein said multiplexer provides an output data path to output final results of operations.

15. The system of claim 7, wherein said control circuit comprises a user interface for setting said modes of operations.

16. The system of claim 7, wherein said control circuit comprises a finite state machine to supply the system with a bus enable signal for providing a signal path between said registers and said multiplier-adder sets.

17. A method of determining errors and erasures in data read from an optical disk medium comprising the steps of:

storing polynomial data indicating occurrence of the errors and erasures in the read data in a shift register array arranged in a two-dimensional matrix to provide bidirectional vertical and bidirectional horizontal data shifts, controlling the bidirectional vertical and horizontal data shifts in the shift register array to perform recursive division and multiplication of the polynomial data in a first mode of operation, polynomial expansion of the polynomial data in a second mode of operation, modulo polynomial multiplication of the polynomial data in a third mode of operation, and regular polynomial multiplication of the polynomial data in a fourth mode of operation, and switching between said first, second, third and fourth modes of operation to generate signals indicating values and locations of said errors and erasures.

18. The method of claim 17, wherein intermediate results of the performing steps are used without saving into a permanent memory.

19. The method of claim 17, wherein the steps of performing polynomial multiplication include dynamic monitoring of the stored polynomial data to start multiplication from the least significant bit of the polynomial data involved in the multiplication in order to reduce a number of iterations required for the multiplication.

20. The method of claim 17, wherein said first, second, third and fourth mode of operations are carried out by the same arithmetic elements.

21. The method of claim 17, wherein the recursive division and multiplication in the first mode of operation are performed by the same arithmetic elements.

22. The apparatus of claim 2, wherein a number of said multiplier-adder sets corresponds to a number of said rows in said vertical shift register arrays.

23. The system of claim 8, wherein the same multiplier-adder sets perform the recursive multiplication, the recursive division, the polynomial expansion and the polynomial multiplication of the signals.

* * * * *